United States Patent
Moon et al.

(10) Patent No.: US 11,837,416 B2
(45) Date of Patent: Dec. 5, 2023

(54) ELECTRONIC DEVICE INCLUDING KEY BUTTON

(71) Applicant: Samsung Electronics Co., Ltd., Suwon-si (KR)

(72) Inventors: Heecheul Moon, Suwon-si (KR); Kwonho Son, Suwon-si (KR); Sangyoup Seok, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 390 days.

(21) Appl. No.: 17/152,161

(22) Filed: Jan. 19, 2021

(65) Prior Publication Data
US 2021/0241984 A1     Aug. 5, 2021

(30) Foreign Application Priority Data
Feb. 3, 2020 (KR) ........................ 10-2020-0012792

(51) Int. Cl.
*H01H 13/14* (2006.01)
*H01H 13/86* (2006.01)
(Continued)

(52) U.S. Cl.
CPC .......... *H01H 13/14* (2013.01); *G06F 1/1626* (2013.01); *H01H 13/06* (2013.01); *H01H 13/86* (2013.01);
(Continued)

(58) Field of Classification Search
None
See application file for complete search history.

(56) References Cited

U.S. PATENT DOCUMENTS 11,058,018 B1 * 7/2021 Yoon ..................... H05K 5/0017
2004/0037051 A1 * 2/2004 Hagiwara ............. G06F 3/0202
                                                                           361/749
(Continued)

FOREIGN PATENT DOCUMENTS

EP            3 340 589 A1    6/2018
KR      2002-0052696 A    7/2002
(Continued)

OTHER PUBLICATIONS

European Search Report dated Oct. 5, 2022, issued in European Application No. 21750823.3.
(Continued)

*Primary Examiner* — Krystal Robinson
(74) *Attorney, Agent, or Firm* — Jefferson IP Law, LLP

(57) ABSTRACT

An electronic device is provided. The electronic device includes a housing including an outer surface configured to at least partially form an external appearance of the electronic device, a button accommodation recess having a predetermined depth from the outer surface in a first direction oriented to the inner space of the electronic device, and at least one through-hole connected to the inner surface of the housing in the button accommodation recess, a key button disposed through the button accommodation recess, and including a key top inserted into the button accommodation recess and at least partially exposed to the outside, and a key base coupled to the key top, and including a protrusion facing a key flexible printed circuit board (FPCB) disposed in the inner space through the at least one through-hole. The protrusion may include an engagement portion formed at an end thereof to be larger than the protrusion.

22 Claims, 20 Drawing Sheets

(51) Int. Cl.
*H01H 13/06* (2006.01)
*H05K 5/00* (2006.01)
*G06F 1/16* (2006.01)
*H05K 5/06* (2006.01)

(52) U.S. Cl.
CPC ........... *H05K 5/0017* (2013.01); *H05K 5/061* (2013.01); *H01H 2221/08* (2013.01)

(56) References Cited

U.S. PATENT DOCUMENTS

| | | |
|---|---|---|
| 2006/0037848 A1 | 2/2006 | Kobayashi |
| 2012/0162936 A1* | 6/2012 | Fujimori ............ H04M 1/0277 343/702 |
| 2012/0268879 A1 | 10/2012 | Kim et al. |
| 2014/0144762 A1 | 5/2014 | Cheong |
| 2015/0219608 A1* | 8/2015 | Choi .................. G01N 33/0009 73/23.2 |
| 2017/0213068 A1 | 7/2017 | Chang et al. |
| 2017/0347478 A1* | 11/2017 | Park ..................... H04B 1/3816 |
| 2018/0183912 A1 | 6/2018 | Lim et al. |
| 2018/0358190 A1 | 12/2018 | Lee et al. |
| 2019/0080860 A1 | 3/2019 | Choi et al. |
| 2019/0317553 A1 | 10/2019 | Cho et al. |
| 2020/0106167 A1* | 4/2020 | Moon ................... H04M 1/026 |
| 2020/0183455 A1* | 6/2020 | Park ....................... G06F 1/1656 |
| 2020/0348725 A1* | 11/2020 | Kim .................... H04M 1/0266 |
| 2021/0091148 A1* | 3/2021 | Kim, II ................ H10K 50/844 |
| 2021/0120150 A1* | 4/2021 | Moon ................... G03B 17/12 |

FOREIGN PATENT DOCUMENTS

| | | |
|---|---|---|
| KR | 10-2012-0120661 A | 11/2012 |
| KR | 10-2017-0045090 A | 4/2017 |
| KR | 10-2017-0087684 A | 7/2017 |
| KR | 10-1912815 B1 | 1/2019 |
| KR | 10-2029287 B1 | 10/2019 |

OTHER PUBLICATIONS

International Search Report dated Apr. 23, 2021, issued in International Application No. PCT/KR2021/000589.

* cited by examiner

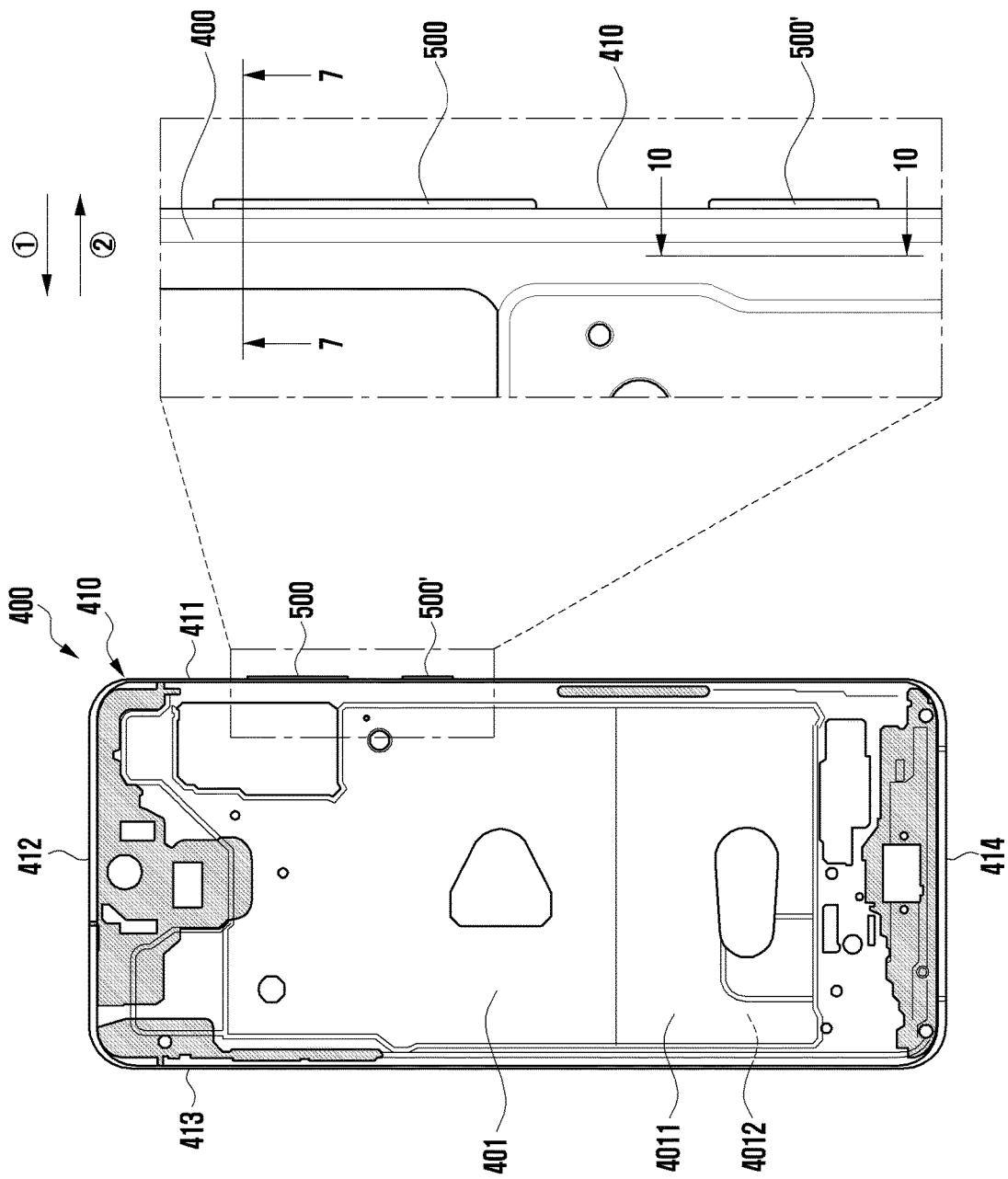

ELECTRONIC DEVICE INCLUDING KEY BUTTON

CROSS-REFERENCE TO RELATED APPLICATION(S)

This application is based on and claims priority under 35 U.S.C. § 119(a) of a Korean patent application number 10-2020-0012792, filed on Feb. 3, 2020, in the Korean Intellectual Property Office, the disclosure of which is incorporated by reference herein in its entirety.

BACKGROUND

1. Field

The disclosure relates to an electronic device including a key button. More particularly, the electronic device may include one or more key buttons disposed to be at least partially exposed from the inner space to the outside.

2. Description the Related Art

Electronic devices are being gradually slimmed and are being developed to increase the rigidity, to enhance the design aspect, and to differentiate functional elements thereof.

An electronic device may include a plurality of electronic components disposed in the inner space thereof. These electronic components may be required to have an efficient arrangement structure for performing respective unique functions thereof in an inner space of the electronic device without disturbing each other's functions.

The above information is presented as background information only to assist with an understanding of the disclosure. No determination has been made, and no assertion is made, as to whether any of the above might be applicable as prior art with regard to the disclosure.

SUMMARY

An electronic device may include one or more key buttons disposed to be at least partially exposed from the inner space to the outside. In general, the one or more key buttons are exposed through a side frame of the electronic device, thereby providing convenience of operation. These key buttons may be used to execute various functions, such as a volume up/down function, a wake-up/sleep function, a power on/off function, or an artificial intelligence execution function according to a user's operation.

The electronic device may include a side frame (e.g., a side bezel) made of a metal material that may improve aesthetics by being at least partially exposed to the outside and that may contribute to reinforcement of rigidity. The electronic device may include a housing structure including a front cover (e.g., a front plate or a window) coupled to a first surface of the side frame and a rear cover (e.g., a rear plate) coupled to a second surface opposite to the first surface.

Meanwhile, the key buttons may be at least partially inserted through the button accommodation groove formed in the side frame, and the protrusions of the key buttons may enter the inner space of the electronic device through through-holes formed in the button accommodation recess, and may perform a switching operation by pressing dome keys of a flexible printed circuit board (FPCB) disposed in the inner space. In this case, the key buttons may each have at least one engagement projection, and the at least one engagement projections may be engaged with a corresponding one of engagement holes formed in the button accommodation recess, thereby preventing the key buttons from being inadvertently separated. For example, for convenience of machining, the engagement holes may be formed to penetrate from the first surface and/or the second surface to the button accommodation recess in a direction perpendicular to the direction of processing the button accommodation recess using a machining tool.

However, the side frame adopted for reinforcing rigidity may have a problem in that the rigidity is weakened by the button accommodation recess and may be further weakened due to the multiple of engagement holes described above. Furthermore, foreign matter may be introduced into the button accommodation recess through the engagement holes positioned between the front cover or the rear cover and the side frame, which may result in contamination of the key buttons and may hence cause a malfunction.

Aspects of the disclosure are to address at least the above-mentioned problems and/or disadvantages and to provide at least the advantages described below. Accordingly, an aspect of the disclosure is to provide an electronic device including a key button.

Another aspect of the disclosure is to provide an electronic device including a key button configured to contribute to reinforcement of rigidity while including a smooth key button assembly structure.

Another aspect of the disclosure is to provide an electronic device including a key button that ensures product reliability concerning long-term use by preventing external foreign matter from flowing into the button accommodation recess.

Additional aspects will be set forth in part in the description which follows and, in part, will be apparent from the description, or may be learned by practice of the presented embodiments.

In accordance with an aspect of the disclosure, an electronic device is provided. The electronic device includes a housing including an outer surface configured to at least partially form an external appearance of the electronic device, a button accommodation recess having a predetermined depth from the outer surface in a first direction oriented to the inner space of the electronic device, and at least one through-hole connected to the inner surface of the housing in the button accommodation recess, a key button disposed through the button accommodation recess, and including a key top inserted into the button accommodation recess and at least partially exposed to the outside, and a key base coupled to the key top, and including a protrusion facing a key FPCB disposed in the inner space through the at least one through-hole. The protrusion may include an engagement portion formed at an end thereof to be larger than the protrusion, and after the protrusion passes through the at least one through-hole, the engagement portion may be engaged with the inner surface around the at least one through-hole.

In accordance with another aspect of the disclosure, an electronic device is provided. The electronic device includes a front cover, a rear cover facing away from the front cover, a side frame connecting the front cover and the rear cover and including an outer surface configured to at least partially form the external appearance of the electronic device, a button accommodation recess having a predetermined depth from the outer surface in a first direction oriented to the inner space of the electronic device, and at least one through-hole connected to the inner surface of the side frame in the button accommodation recess, and a key button disposed through the button accommodation recess and including a key top inserted into the button accommodation recess and at least partially exposed to the outside, and a key base coupled to the key top and including a protrusion facing a key FPCB disposed in the inner space through the at least one through-hole. The protrusion may include a first inclined surface, the at least one through-hole may include an engagement portion including a second inclined surface, and when the protrusion passes through the at least one through-hole, the first inclined surface of the engagement portion may be engaged with the second inclined surface.

In accordance with another aspect of the disclosure, an electronic device is provided. The electronic device includes a front cover, a rear cover facing away from the front cover, a side frame connecting the front cover and the rear cover and including an outer surface configured to at least partially form an external appearance of the electronic device, a button accommodation recess having a predetermined depth from the outer surface in a first direction oriented to an inner space of the electronic device, and at least one through-hole connected to an inner surface of the side frame in the button accommodation recess, a key button disposed through the button accommodation recess and including a key top inserted into the button accommodation recess and at least partially exposed to an outside, and a key base coupled to the key top and including a protrusion facing a key FPCB disposed in the inner space through the at least one through-hole, wherein the protrusion includes an engagement portion formed at an end thereof to be larger than the protrusion, and after the protrusion passes through the at least one through-hole, the engagement portion is engaged with the inner surface around the at least one through-hole, and a waterproof member disposed between the key FPCB and the inner surface of the side frame to be in close contact therewith, the waterproof member being configured to seal a periphery of the at least one through-hole including the engagement portion and a periphery of the dome key.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 4 is a plan view illustrating a side frame including key buttons according to an embodiment of the disclosure;

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
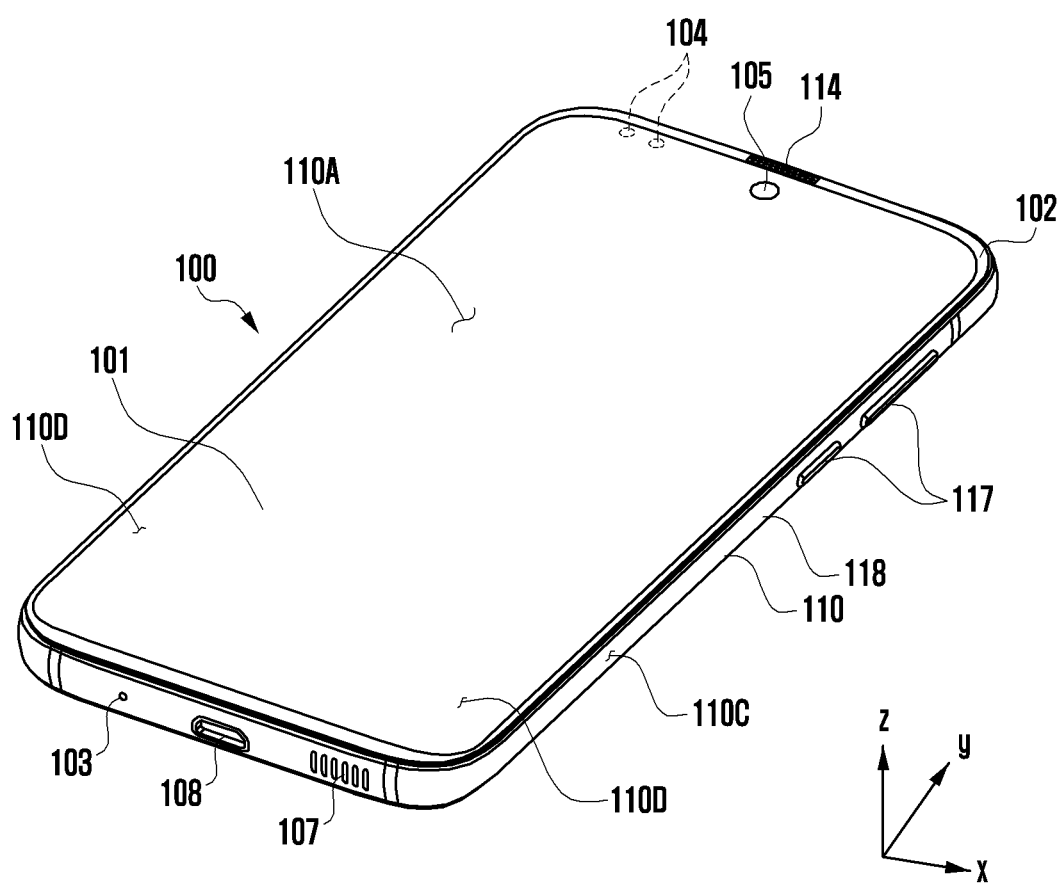
FIG. 1 is a perspective view illustrating a front surface of an electronic device according to an embodiment of the disclosure.

FIG. 1 illustrates a perspective view illustrating a front surface of an electronic device according to an embodiment of the disclosure.

Figure 2:
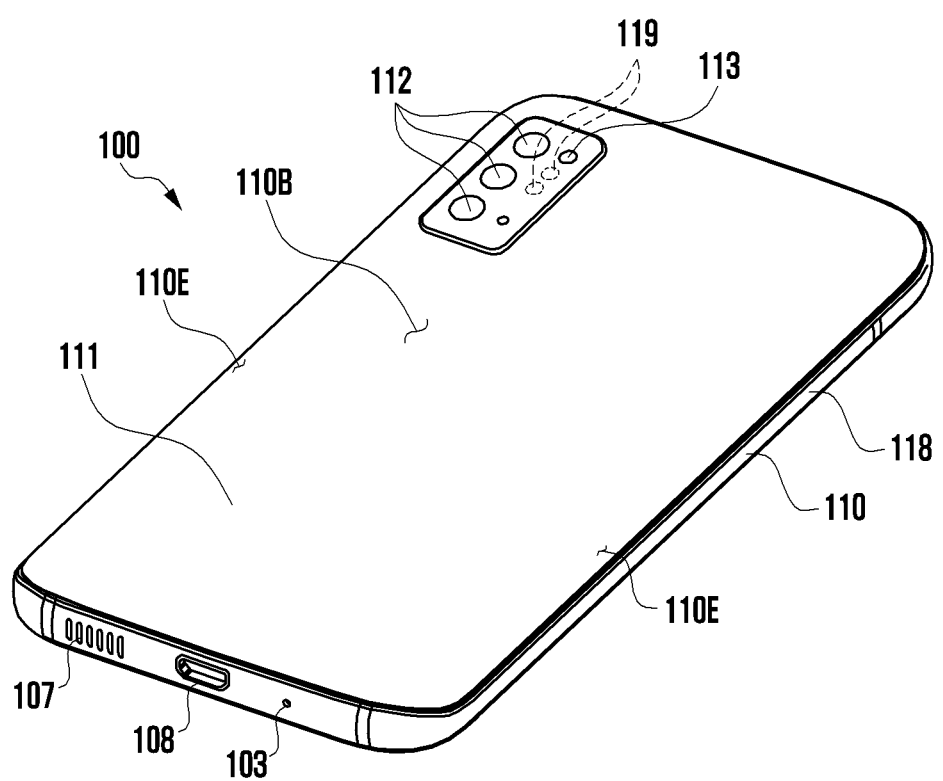
FIG. 2 is a perspective view illustrating a rear surface of an electronic device of FIG. 1 according to an embodiment of the disclosure.

FIG. 2 illustrates a perspective view illustrating a rear surface of an electronic device of FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material, such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector hole 108. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device. At least one of the audio module 114, the sensor module 104, the camera module 105, a fingerprint sensor (not shown), and the light emitting element may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112, and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form, such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector hole 108 may include a first connector hole 108 adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment of the disclosure, some sensor modules 104 may be arranged to perform their functions without being visually exposed through the front plate 102 in the internal space of the electronic device. For example, in this case, an area of the display 101 facing the sensor module may not require a perforated opening.

Figure 3:
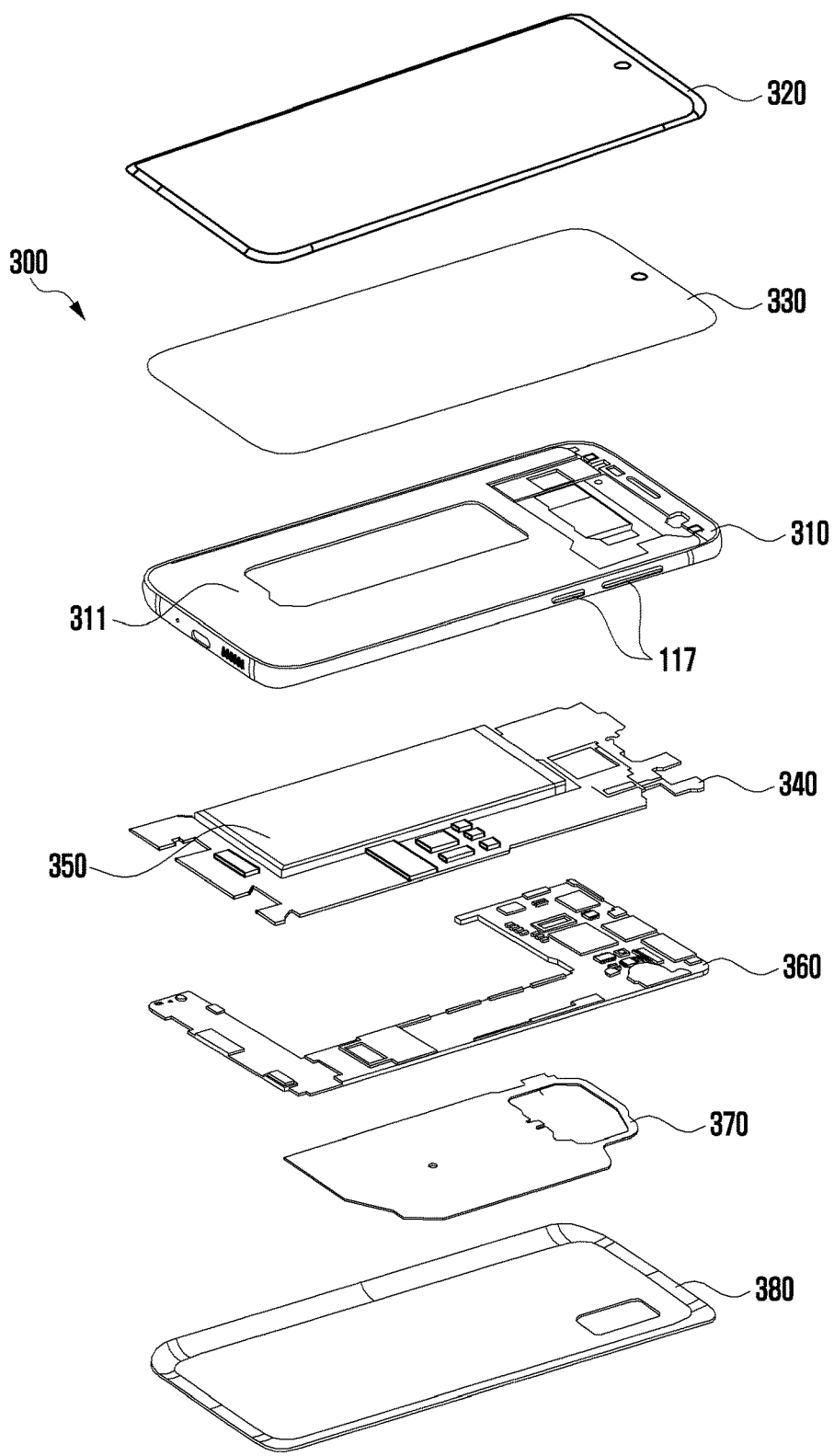
FIG. 3 is an exploded perspective view illustrating an electronic device of FIG. 1 according to an embodiment of the disclosure.

FIG. 3 illustrates an exploded perspective view illustrating a mobile electronic device of FIG. 1 according to an embodiment of the disclosure.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the mobile electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

FIG. 4 is a plan view of a side frame including key buttons according to an embodiment of the disclosure.

Referring to FIG. 4, it illustrates a plan view of the electronic device from which a front cover (e.g., the front plate 320 in FIG. 3) including a display (e.g., the display 330 in FIG. 3) is removed.

The electronic device 400 and a side frame 410 of FIG. 4 are at least partially similar to the mobile electronic device 300 and the side member (i.e., the lateral bezel structure 310 of FIG. 3) (e.g., a side bezel structure), or may include another embodiment of the electronic device and the side frame.

Referring to FIG. 4, the electronic device 400 (e.g., the mobile electronic device 300 in FIG. 3) may include a side frame 410 (e.g., the lateral bezel structure 310 in FIG. 3) including a first surface 4011 facing the front cover (e.g., the front plate 320 in FIG. 3) and a second surface 4012 facing the rear cover (e.g., the rear plate 380 in FIG. 3). According to an embodiment of the disclosure, the side frame 410 may include a first side surface 411 having a first length, a second side surface 412 extending in a vertical direction from one end of the first side surface 411 and having a second length, a third side surface 413 extending from the second side surface 412 in a direction parallel to the first side surface 411 and having the first length, and a fourth side surface 414 extending from the third side surface 413 to the other end of the first side surface 411 and having the second length. According to an embodiment of the disclosure, the first length may be longer than the second length. In some embodiments of the disclosure, the first length may be shorter than the second length. According to an embodiment of the disclosure, the side frame 410 may include a support plate 401 (e.g., the first support member 311 in FIG. 3) extending into the inner space of the electronic device 400. According to an embodiment of the disclosure, the support plate 401 may be extend from at least one of the first side surface 411, the second side surface 412, the third side surface 413, or the fourth side surface 414. In some embodiments of the disclosure, the support plate 401 may be disposed through structural coupling with at least one of the first side surface 411, the second side surface 412, the third side surface 413, or the fourth side surface 414. According to an embodiment of the disclosure, the side frame 410 may be made of a metal material (e.g., aluminum). In some embodiments of the disclosure, the side frame may further include a polymer that is injection-molded (insert-injection-molded or double-injection-molded) into the metal material.

According to various embodiments of the disclosure, the electronic device 400 may include one or more key buttons 500 and 500' (e.g., the key button 117 in FIG. 3), which are at least partially exposed from the first side surface 411 of the side frame 410. As illustrated, the one or more key buttons 500 and 500' may include a first key button 500 having a pair of pressing points spaced apart from each other and a second key button 500' having one pressing point. According to an embodiment of the disclosure, the first key button 500 may be used for, for example, a volume up/down function or a function of scrolling an object displayed on the display. According to an embodiment of the disclosure, the second key button 500' may be used for various functions, such as a wake-up/sleep function, a power on/off function, a camera device execution function, or an artificial intelligence execution function. According to an embodiment of the disclosure, when the one or more key buttons 500 and 500' are pressed in a first direction oriented to the inner space (the direction ①) of the electronic device 400 in the state of protruding from the first side surface 411 of the side frame 410, a dome key (e.g., the dome key 541 in FIG. 6A) disposed inside the electronic device 400 may be pressed so as to perform a switching function. According to an embodiment of the disclosure, when the pressing force is removed from the one or more key buttons 500 and 500', the one or more key buttons 500 and 500 may be moved in a second direction oriented to the outside of the electronic direction (the direction ②) by the restoring force of the dome key (e.g., the dome key 541 in FIG. 6A) so as to be restored to the original position thereof. In some embodiments of the disclosure, the one or more key buttons 500 and 500' may be disposed on at least one of the second side surface 412, the third side surface 413, or the fourth side surface 414.

According to various embodiments of the disclosure, except for a button accommodation recess (e.g., the button accommodation recess in FIG. 6A) disposed for assembly of the one or more key buttons 500 and 500', by excluding a machined area, which may be formed on the outer surface thereof (e.g., a recess or a hole for a key button engagement structure), the side frame 410 is capable of helping reinforce rigidity and capable of fundamentally blocking the inflow of foreign matter.

Figure 5A:
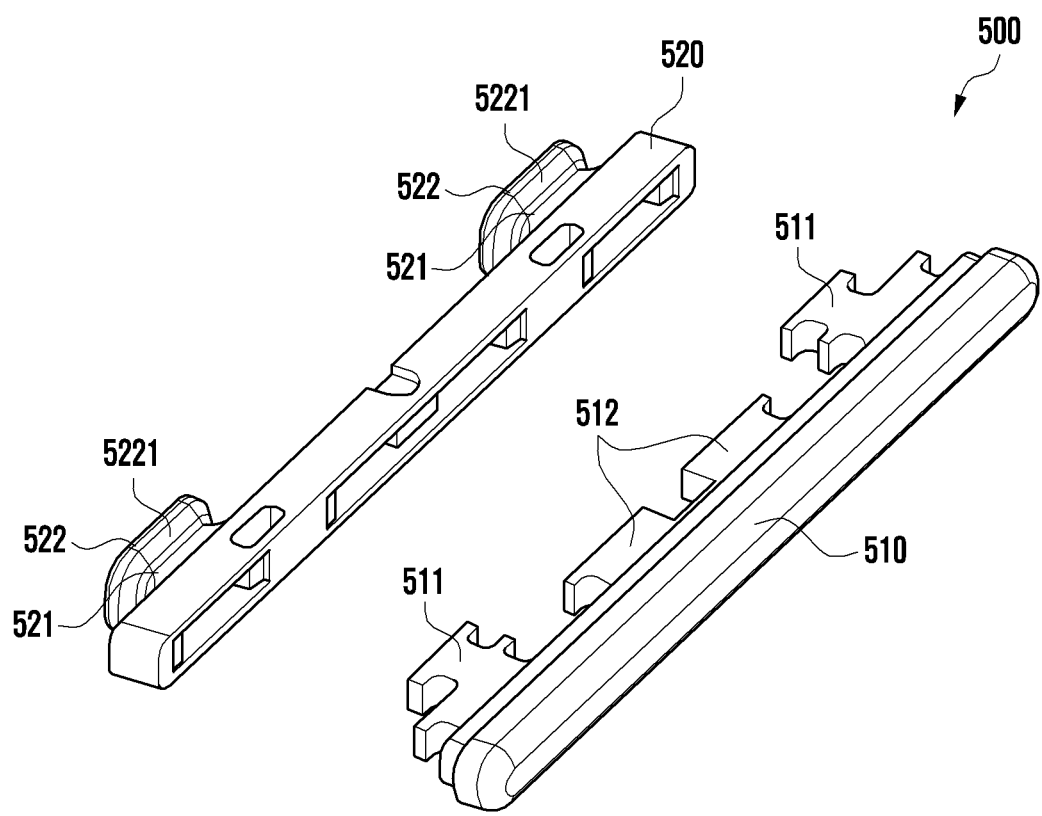
FIG. 5A is a perspective view illustrating a key button in a disassembled state according to an embodiment of the disclosure.

FIG. 5A is a perspective view illustrating a key button in a disassembled state according to an embodiment of the disclosure.

Figure 5B:
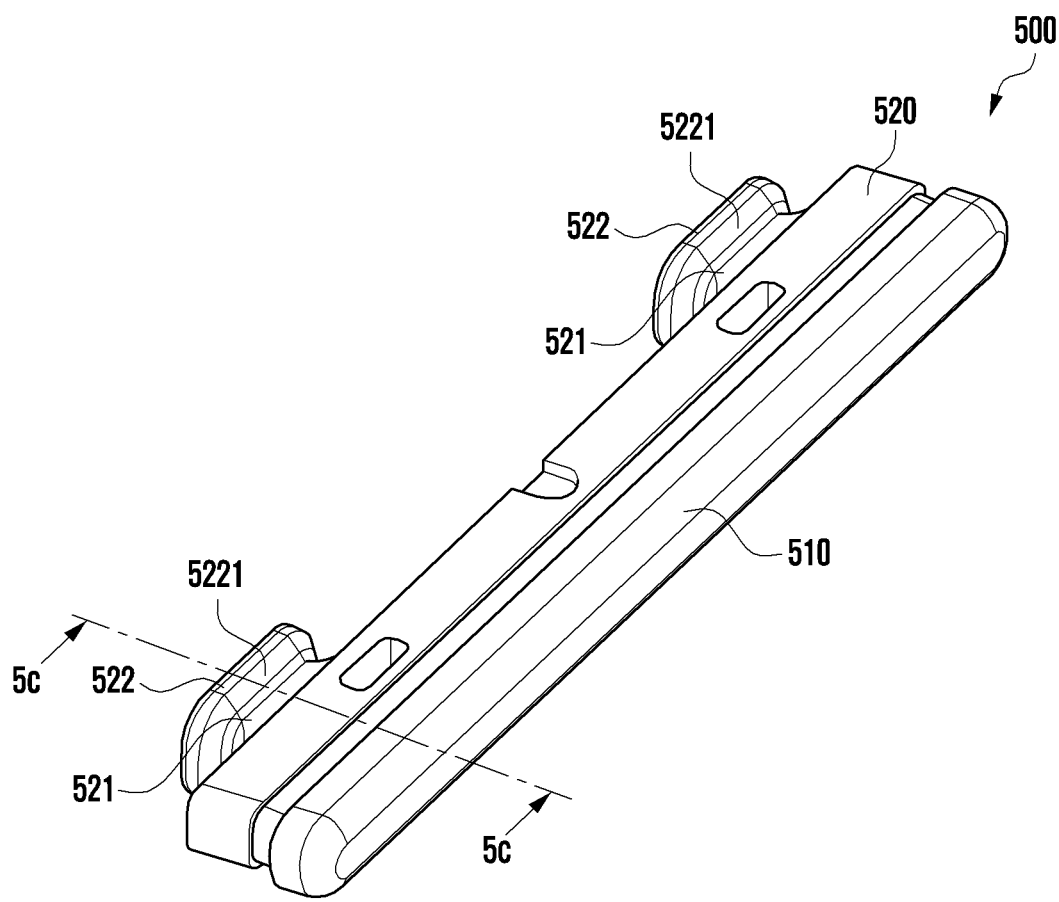
FIG. 5B is a perspective view illustrating a key button in an assembled state according to an embodiment of the disclosure.

FIG. 5B is a perspective view illustrating a key button in an assembled state according to an embodiment of the disclosure.

Figure 5C:
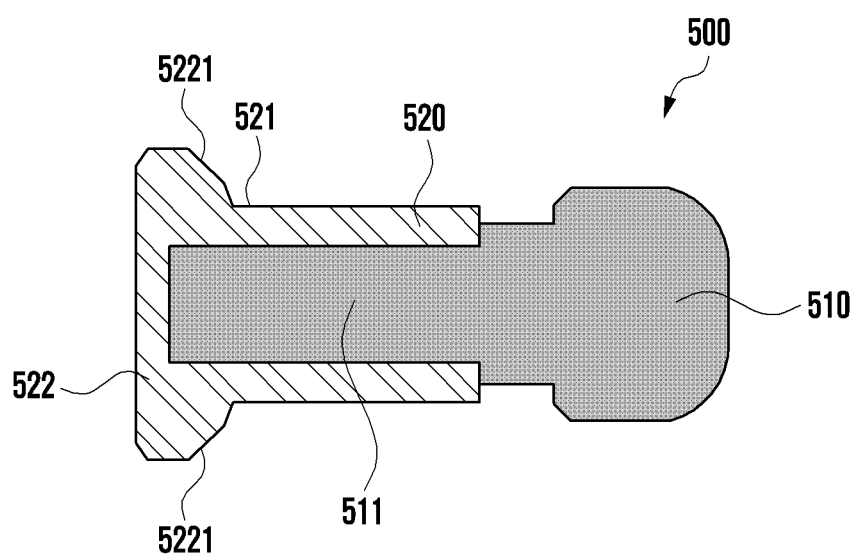
FIG. 5C is a cross-sectional view of a key button taken along line 5c-5c in FIG. 5B according to an embodiment of the disclosure.

FIG. 5C is a cross-sectional view of a key button taken along line 5c-5c in FIG. 5B according to an embodiment of the disclosure.

Referring to FIGS. 5A, 5B, and 5C, the key button 500 (e.g., the first key button 500) may include a key top 510 and a key base 520 coupled to the key top 510. According to an embodiment of the disclosure, since the key top 510 has a configuration that is at least partially exposed to the outside of an electronic device (e.g., the electronic device 400 in FIG. 4), the key top 510 may be made of a metal material that is stain-resistant and excellent in durability (e.g., aluminum or stainless steel). According to an embodiment of the disclosure, the key base 520 may be made a polymer (e.g., thermoplastic polyurethane (TPU) or polycarbonate (PC) so as to facilitate formation of a protrusion 521 according to an embodiment of the disclosure and an engagement portion 522 formed at the end of the protrusions 521. Accordingly, the key button 500 may be manufactured in a manner in which the key base 520 made of a polymer material is injection-molded into the key top 510 made of a metal material. In some embodiments of the disclosure, in the key button 500, the key top 510 and the key base 520 may be integrally formed using the same material, such as a metal material or a polymer. In some embodiments of the disclosure, the key button 500 may further include a separate additional structure (e.g., rubber, silicone, or urethane) disposed between the key top 510 and the key base 520.

According to various embodiments of the disclosure, the key base 520 may include at least one protrusion 521 protruding in the mounting direction of the key button 500 (e.g., the direction ① in FIG. 4). According to an embodiment of the disclosure, the number of protrusions 521 may be the same as the number of dome keys (e.g., the dome keys 541 in FIG. 6A) disposed in the inner space of the electronic device 400. For example, the key button 500 may include a pair of protrusions 521 spaced apart from each other. According to an embodiment of the disclosure, each of the protrusions 521 may include an engagement portion 522 formed at the end thereof. According to an embodiment of the disclosure, the engagement portions 522 may have a volume larger than that of the protrusions 521 such that the engagement portions 522 are engaged with the inner surface (e.g., the inner surface 4102 in FIG. 7) of the side frame 410 after passing through respective through-holes (e.g., the through-holes 4111a and 4111b in FIG. 6A) formed in the button accommodation recess (e.g., the button accommodation recess 4111 in FIG. 6A) in the side frame 410 to be described later. According to an embodiment of the disclosure, each of the engagement portions 522 may include a first inclined surface 5221 inclined such that the size thereof gradually increases in the mounting direction (e.g., the direction ① in FIG. 4) of the key button. According to an embodiment of the disclosure, the engagement portions 522 may pass through respective through-holes (e.g., through-holes 4111a and 4111b in FIG. 6B) in a force-fitting manner, and may be then engaged such that the engagement portions 522 are not separated outwards (e.g., in the direction ② in FIG. 4). Accordingly, each of the through-holes (e.g., the through-holes 4111a and 4111b in FIG. 6B) may have a second inclined surface (e.g., the second inclined surface 4113 in FIG. 7), which is gradually narrowed from the inner surface (e.g., the inner surface 4102 in FIG. 7) of the side frame 410 toward the outer surface (e.g., the outer surface 4101 in FIG. 7) of the side frame 410. Accordingly, after the engagement portions 522 pass through the through-holes (e.g., the through-holes 4111a and 4111b in FIG. 6B), the first inclined surfaces 5221 are engaged with the second inclined surface (e.g., the second inclined surfaces 4113 in FIG. 7), respectively. Thus, the key button 500 can be smoothly installed and operated in the button accommodation recess (e.g., the button accommodation recess 4111 in FIG. 6A). Furthermore, the key button cannot be arbitrarily removed due to the engagement structure between the first inclined surfaces 5221 and the second inclined surfaces (e.g., the second inclined surfaces 4113 in FIG. 7).

According to various embodiments of the disclosure, the key top 510 may include support projections 511 extending in the mounting direction of the key button 500 (e.g., direction ① in FIG. 4). According to an embodiment of the disclosure, since each support projection 511 extends from the inside of the key base 520 to the vicinity of the engagement portion 522 of a corresponding one of the protrusions 521, it is possible for the protrusion 521 to provide rigidity capable of withstanding the force of pressing a dome key (e.g., the dome key in FIG. 6A) and to help improve the coupling force with the key base 520. According to an embodiment of the disclosure, the rigid structure may help provide an appropriate click feeling for the key button 500. According to an embodiment of the disclosure, the key top 510 may further include one or more extension projections 512 that additionally protrude in order to improve the coupling force with the key base 520.

Figure 6A:
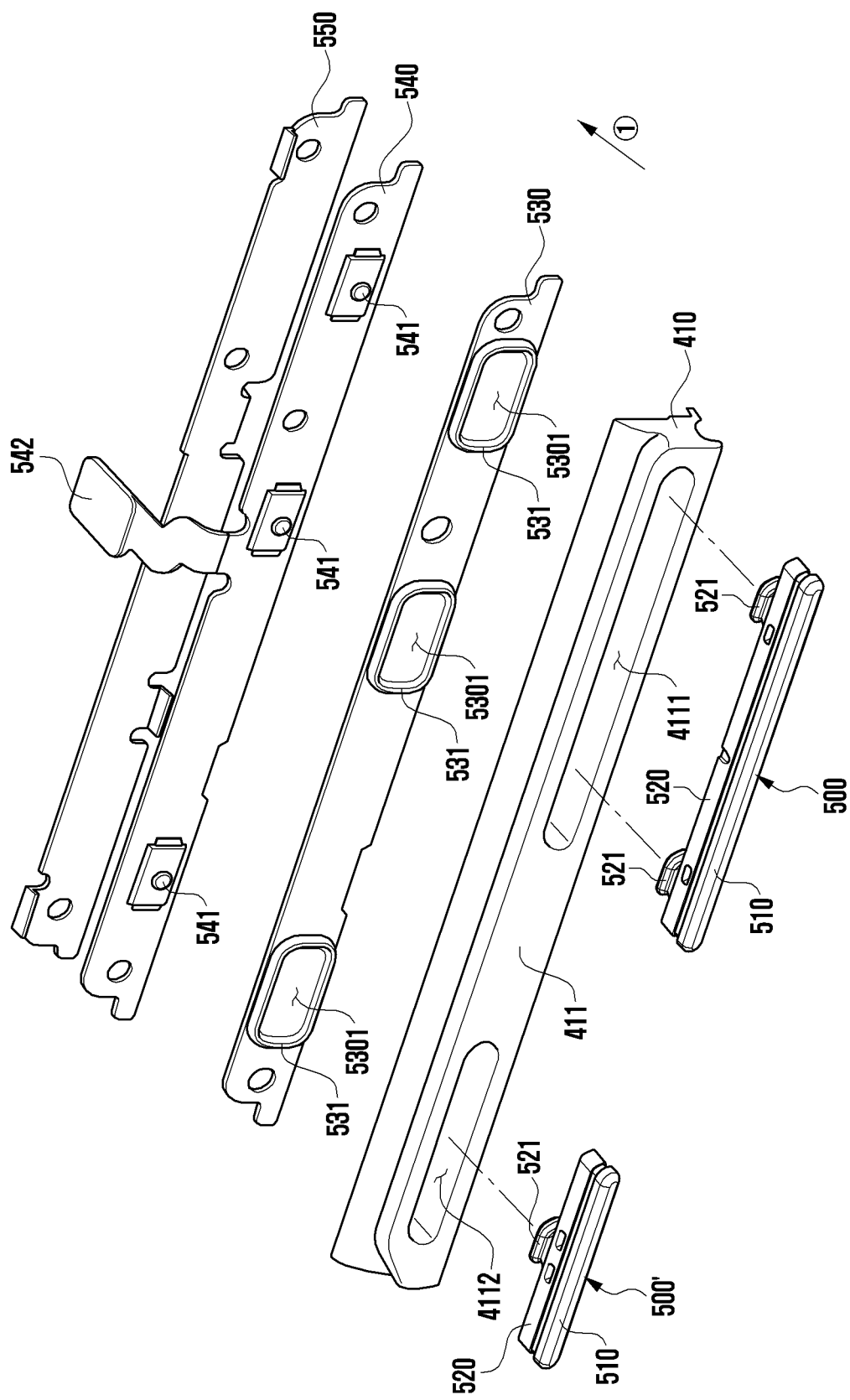
FIG. 6A is a view illustrating an arrangement configuration of a key flexible printed circuit board (FPCB) and key buttons according to an embodiment of the disclosure.

FIG. 6A is a view illustrating an arrangement configuration of a key FPCB and key buttons according to an embodiment of the disclosure.

Referring to FIG. 6A, a side frame 410 may include one or more button accommodation recesses 4111 and 4112 having a predetermined depth from a first side surface 411. According to an embodiment of the disclosure, the button accommodation recesses 4111 and 4112 may have sizes and depths corresponding to the shapes of the one or more key buttons 500 and 500'. For example, the button accommodation recesses 4111 and 4112 may have a depth that causes the key button 500 including a key top 510 and a key base 520 to be at least partially protrude from the first side surface 411. According to an embodiment of the disclosure, an electronic device (e.g., the electronic device 400 in FIG. 4) may include a waterproof member 530, a key flexible printed circuit board (FPCB) 540, a support piece 550, and an elastic piece (e.g., the elastic piece 560 in FIG. 7), which are sequentially disposed from the inner surface of the side frame 410 toward the inner space of the electronic device. According to an embodiment of the disclosure, the waterproof member 530 may include waterproof projections 531 protruding toward the side frame 410 so as to surround through-holes (e.g., through-holes 4111*a*, 4111*b*, and 4112*a* in FIG. 6B) formed through the button reception grooves 4111 and 4112 between the side frame 410 and the key FPCB 540. According to an embodiment of the disclosure, the waterproof member 530 includes accommodation portions 5301 disposed to surround through-holes (e.g., the through-holes 4111*a*, 4111*b*, and 4112*a* in FIG. 6B) using the waterproof projections 531. According to an embodiment of the disclosure, the waterproof member 530 may be made of rubber, urethane, or silicone.

According to various embodiments of the disclosure, the key FPCB 540 may include one or more dome keys 541 disposed at positions corresponding to the through-holes (e.g., the through-holes 4111*a*, 4111*b*, and 4112*a* of FIG. 6B) in the side frame 410. According to an embodiment of the disclosure, the key FPCB 540 may include a terminal portion 542 extends outward from at least a partial area and is electrically connected to a printed circuit board (e.g., the PCB 340 in FIG. 3) of an electronic device (e.g., the electronic device 400 in FIG. 4). According to an embodiment of the disclosure, the support piece 550 may be attached to the key FPCB 540 through an adhesive member, such as double-sided tape, thereby providing rigidity to the key FPCB 540. According to an embodiment of the disclosure, an elastic piece (e.g., the elastic piece 560 in FIG. 7) may wrap at least the support piece 550 to which the key FPCB 540 is attached, and may be mounted on a mounting portion (e.g., the mounting portion 4013 in FIG. 7) on the side frame 410, thereby pressing the key FPCB toward the side frame (e.g., in the direction ② in FIG. 4). According to an embodiment of the disclosure, the support piece 550 and/or the elastic piece (e.g., the elastic piece 560 of FIG. 7) may be made of a metal material, such as stainless steel (SUS).

Figure 6B:
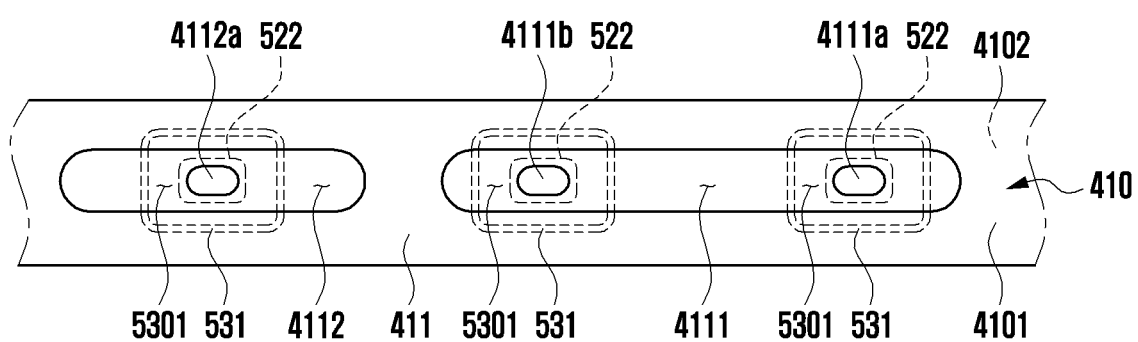
FIG. 6B is a view illustrating an arrangement configuration of key buttons through a waterproof member according to an embodiment of the disclosure.

FIG. 6B is a view illustrating an arrangement configuration of a key button through a waterproof member according to an embodiment of the disclosure.

Figure 6C:
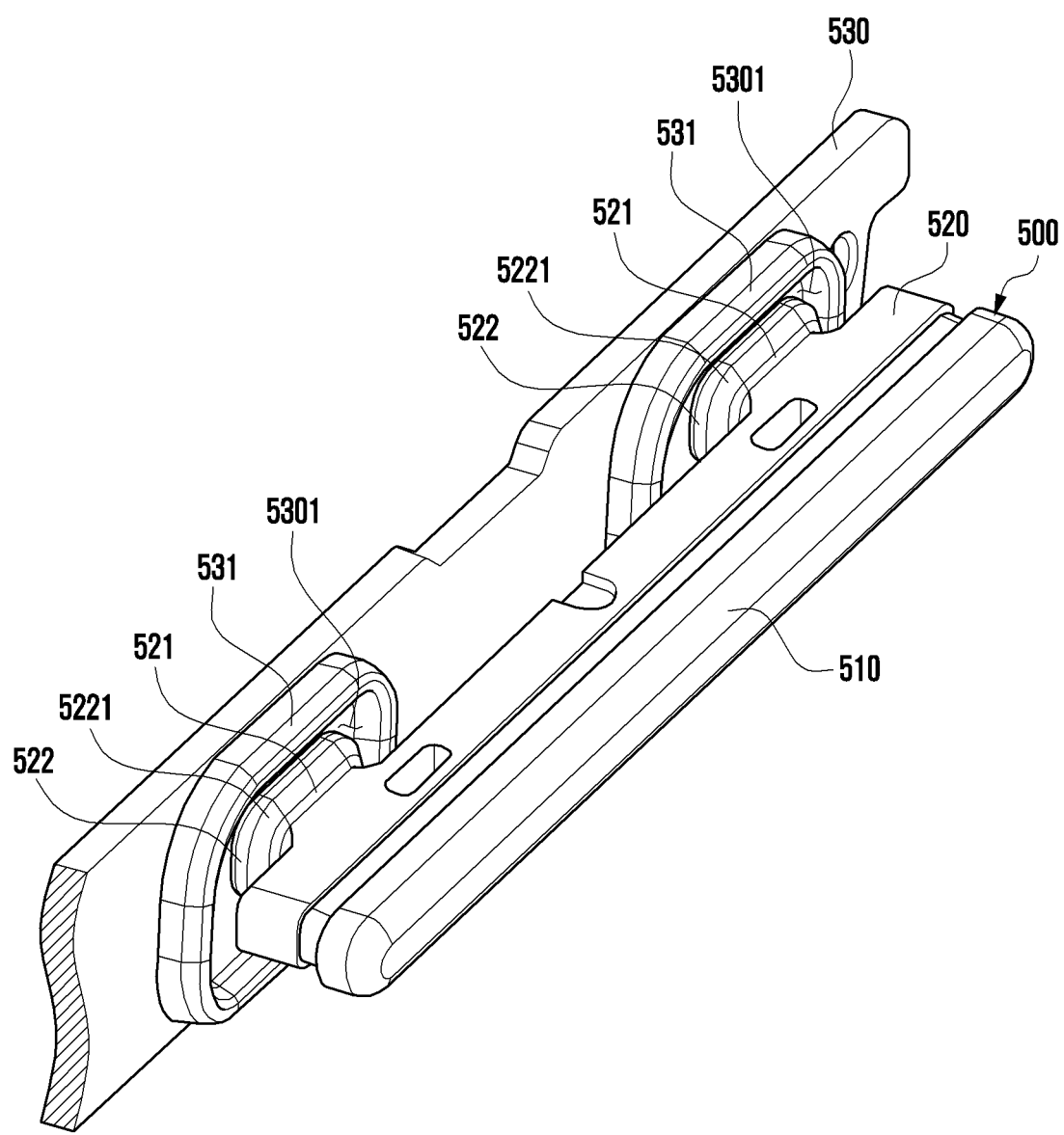
FIG. 6C is a view illustrating an arrangement configuration of key buttons through a waterproof member according to an embodiment of the disclosure.

FIG. 6C is a view illustrating an arrangement configuration of a key button through a waterproof member according to an embodiment of the disclosure.

Referring to FIGS. 6B and 6C, the side frame 410 may include one or more button accommodation recesses 4111 and 4112 having a predetermined depth from the outer surface of the first side surface 411. According to an embodiment of the disclosure, the button accommodation recesses 4111 and 4112 may have sizes and depths corresponding to the shapes of the one or more key buttons 500 and 500'. According to an embodiment of the disclosure, each of the button accommodation recesses 4111 and 4112 may include at least one through-hole 4111*a*, 4111*b*, or 4112*a* connected to the inner space of an electronic device (e.g., the electronic device 400 in FIG. 4). According to an embodiment of the disclosure, when the key buttons 500 and 500' are mounted from the outside of the side frame 410 through the button accommodation recesses 4111 and 4112, the engagement portions 522 pass through the through-holes 4111*a*, 4111*b*, and 4112*a*) in a force-fitting manner. In this case, each of the engagement portions 522 may be disposed in a manner of being accommodated in a corresponding one of the accommodation portions 5301 provided by the inner surface 4102 of the side frame 410 and the waterproof projections 531 of the waterproof member 530. Accordingly, since a waterproof space is formed by the accommodation portions 5301 provided by the waterproof projections 531 of the waterproof member 530, which are in close contact with the inner surface 4102 of the side frame 410, it is possible to prevent foreign mater and/or moisture from being introduced into the inner space of the electronic device (e.g., the electronic device 400 in FIG. 4) even if the foreign matter and/or moisture are introduced through the through-holes 4111*a*, 4111*b*, and 4112*a*.

Figure 7:
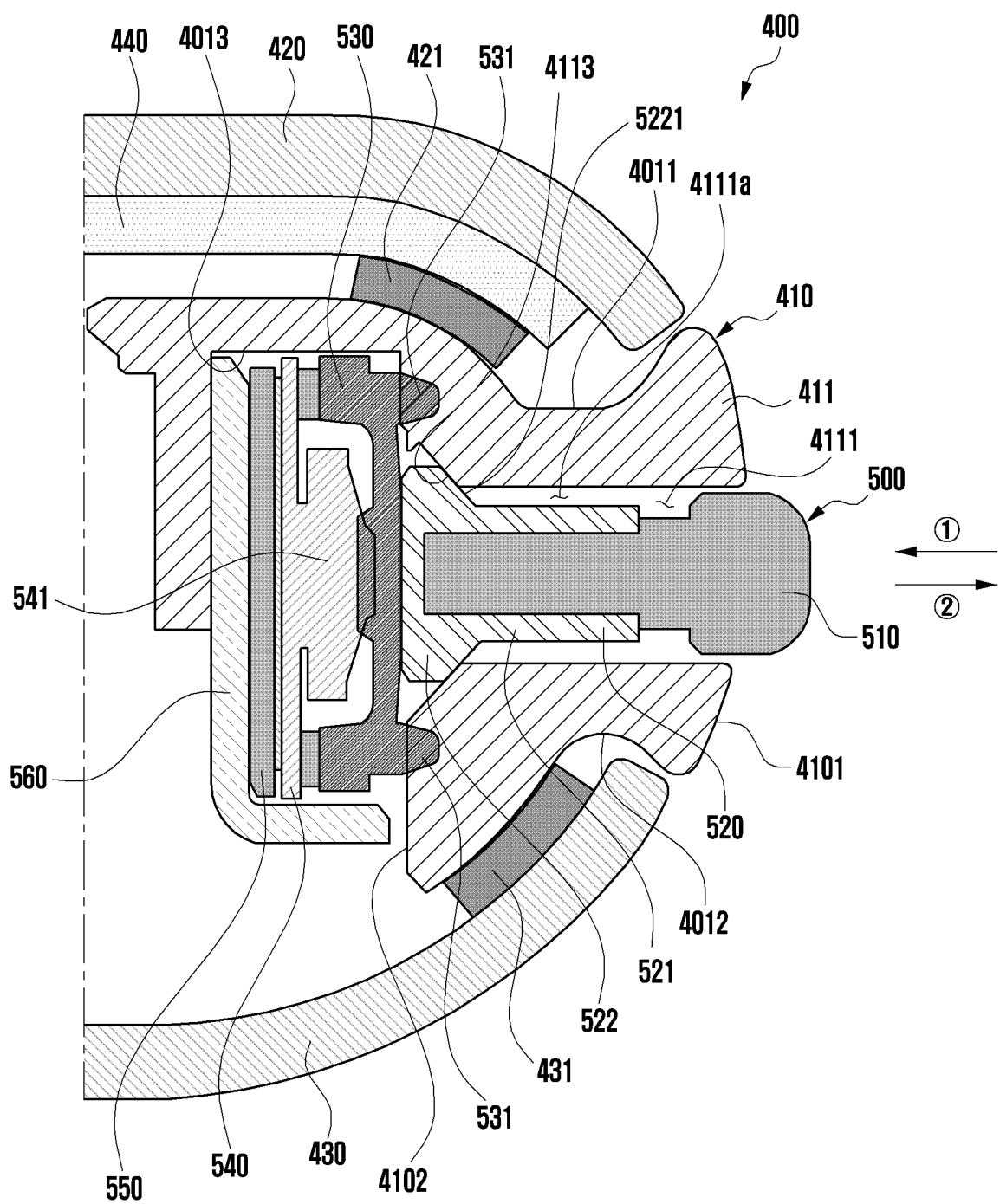
FIG. 7 is a cross-sectional view taken along line 7-7 in FIG. 4, in which a portion of an electronic device, to which a key button is coupled, is illustrated according to an embodiment of the disclosure.

FIG. 7 is a cross-sectional view taken along line 7-7 in FIG. 4, in which a portion of an electronic device, to which a key button is coupled, is illustrated according to an embodiment of the disclosure.

Referring to FIG. 7, the electronic device 400 may include a side frame 410. Although not illustrated, the electronic device 400 may include a front cover 420 (e.g., the front plate 320 in FIG. 3) disposed on the first surface 4011 of the side frame 410, and a rear cover 430 (e.g., the rear plate 380 in FIG. 3) disposed on the second surface 4012 facing away from the first surface 4011. According to an embodiment of the disclosure, the electronic device 400 may include a display 440 (e.g., the display 330 in FIG. 3) disposed between the front cover 420 and the side frame 410 to be at least partially visible from the outside through the front cover 420. According to an embodiment of the disclosure, the electronic device 400 may include a first waterproof sealing member 421 (e.g., a waterproof tape) disposed between the display 440 and the first surface 4011 of the side frame 410. In some embodiments of the disclosure, the first waterproof sealing member 421 may be disposed between the front cover 420 and the first surface 4011 of the side frame 410. According to an embodiment of the disclosure, the electronic device 400 may include a second waterproof sealing member 431 (e.g., a waterproof tape) disposed between the rear cover 430 and the second surface 4012 of the side frame 410. According to an embodiment of the disclosure, the side frame 410 may include a mounting portion 4013 disposed in the inner space of the electronic device. According to an embodiment of the disclosure, the electronic device 400 may include a waterproof member 530, a key FPCB 540 including a dome key 541, a support piece 550, and an elastic piece 560, which are sequentially disposed from the inner surface 4102 of the side frame 410, in the mounting portion 4013 formed in the side frame 410. According to an embodiment of the disclosure, the waterproof member 530, the key FPCB 540, the support piece 550, and the elastic piece 560 may be assembled to each other, and may be mounted on the mounting portion 4013 as an assembly. In this case, the waterproof projection 531 of the waterproof member 530 may be in close contact with the inner surface 4102 of the side frame 410 so as to prevent entrance of foreign matter or moisture.

According to various embodiments of the disclosure, the side frame 410 may include a button accommodation recess 4111 having a predetermined depth from the outer surface 4101. According to an embodiment of the disclosure, the side frame 410 may include a through-hole 4111a formed in the button accommodation recess 4111 to be connected to the inner space of the electronic device 400. According to an embodiment of the disclosure, the through-hole 4111a may have a second inclined surface 4113, which is gradually narrowed in width from the inner surface 4102 toward the outer surface 4101.

According to various embodiments of the disclosure, the electronic device 400 may include a key button 500 that is coupled through the button accommodation recess 4111 in a force-fitting manner. In this case, after the protrusion 521 and the engagement portion 522 of the key button 500 passing through the through-hole 4111a in a force-fitting manner, the engagement portion 522 may be engaged with the inner surface 4102 around the through-hole in the side frame 410, thereby preventing the key button 500 from being inadvertently separated from the button accommodation recess 4111. For example, since the first inclined surface 5221 inclined such that the size of the engagement portion 522 increases in the direction of mounting the key button 500 (in the direction ①) is engaged with the second inclined surface 4113 of the through-hole 4111a, it is possible to prevent the key button 500 from being separated.

According to various embodiments of the disclosure, when the key button 500 is pressed in the first direction (the direction ②), the protrusion 521 and the engagement portion 522 press the waterproof member 530, through which the dome key 541 of the key FPCB 540 facing the waterproof member 530 is pressed so that a switching operation can be performed. According to an embodiment of the disclosure, when the pressing force is removed from the key button 500, the restoring force of the dome key 541 is provided to the engagement portion 522 and the protrusion 521 via the waterproof member 530, whereby the key button 500 can be restored to its original position by retreating in the second direction (the direction ②).

According to an embodiment of the disclosure, since an engagement structure provided to prevent separation from the side frame 410 (e.g., the contact structure between the first inclined surface 5221 and the second inclined surface 4113) is provided together with the protrusion 521 (e.g., a pressing part) for pressing the dome key 541, and an additionally machined area (a groove or a hole) for a separate engagement structure is excluded, the key button 500 is capable of helping reinforce rigidity of the side frame 410 and prevent introduction through the additionally machined area.

According to various embodiments of the disclosure, the above-described engagement structure may also be implemented using any one of the first inclined surface 5221 formed in the engagement portion 522 of the key button 500 or the second inclined surface 4113 formed in the through-hole 4111a. For example, by forming the first inclined surface 5221 on the engagement portion 522, and by forming the through-hole 4111a without any inclined surface, it is possible to configure the first inclined surface 5221 to be engaged with the inner surface 4102 of the side frame 410.

Figure 8A:
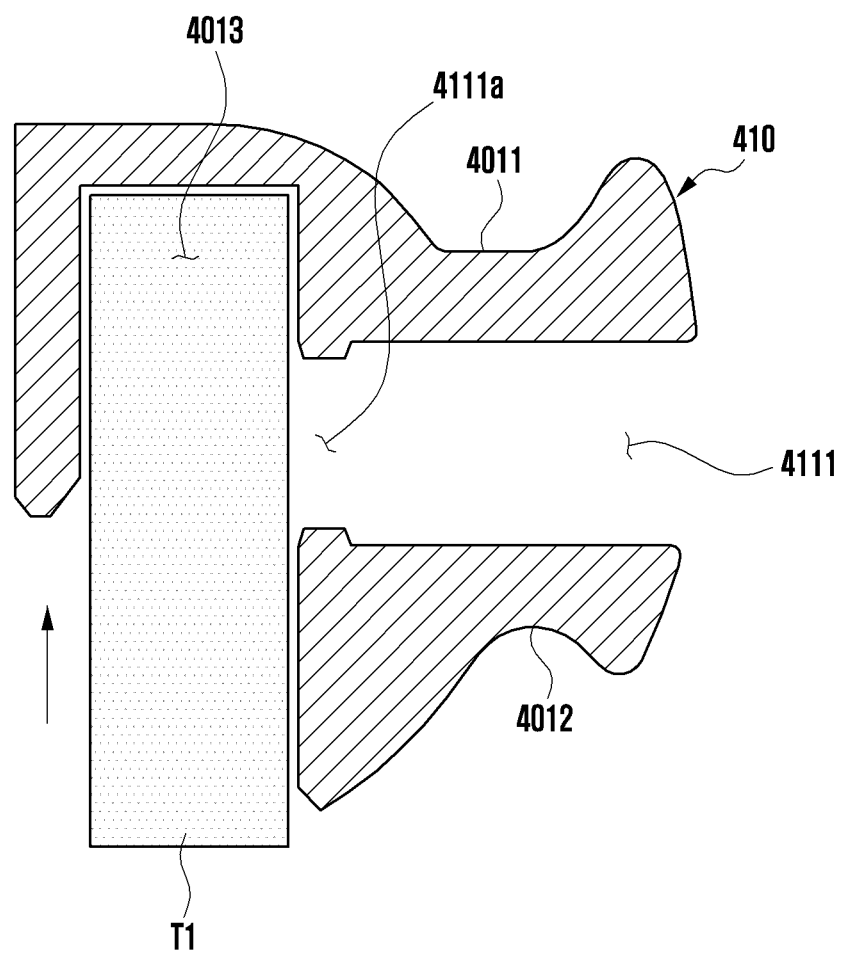
FIG. 8A is a view illustrating a method of machining a second inclined surface formed in a through-hole in a side frame according to an embodiment of the disclosure.

FIG. 8A is a view illustrating a method of machining a second inclined surface in a through-hole of a side frame according to an embodiment of the disclosure.

Figure 8B:
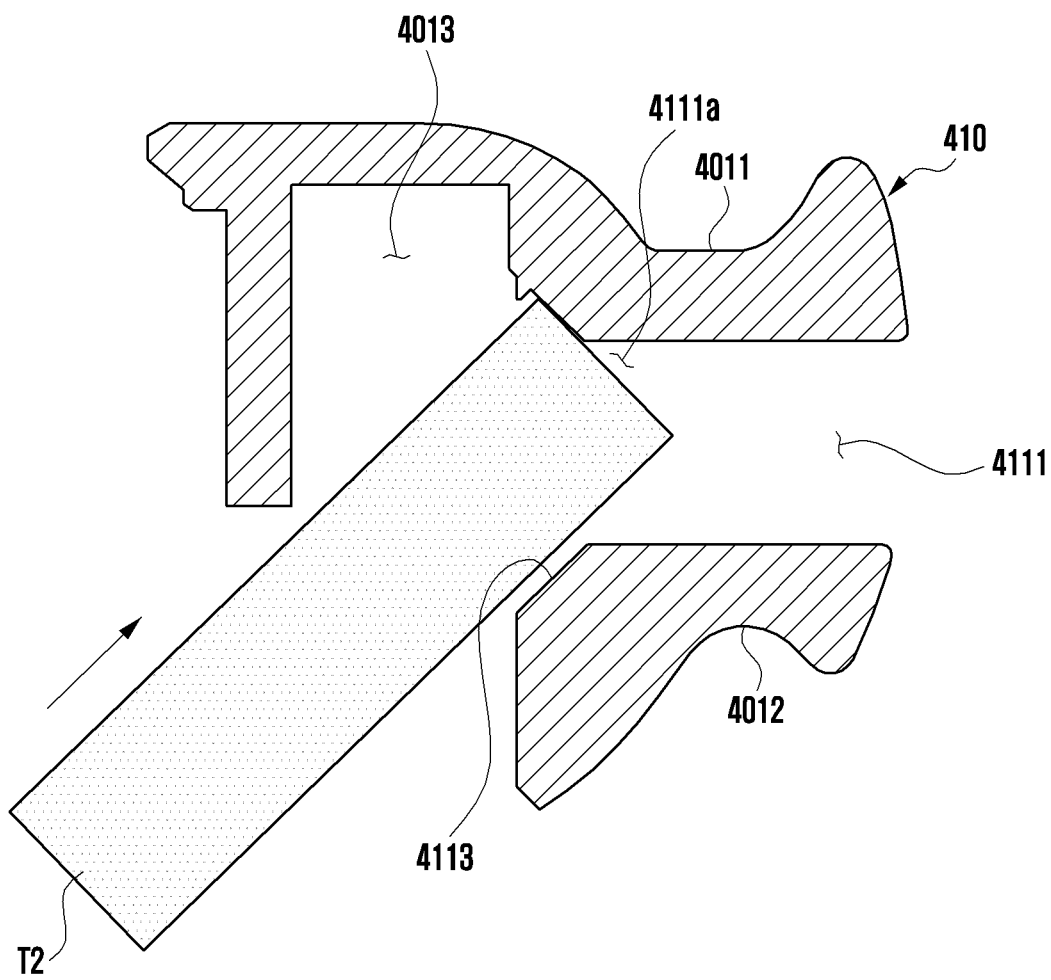
FIG. 8B is a view illustrating a method of machining a second inclined surface formed in a button accommodation recess in a side frame according to an embodiment of the disclosure.

FIG. 8B is a view illustrating a method of machining a second inclined surface in a through-hole of a side frame 410 according to an embodiment of the disclosure.

Referring to FIG. 8A, the side frame 410 may include a mounting portion 4013 formed using a first machining tool T1 (e.g., a forming tool), which is moved from the second surface 4012 to the first surface 4011 in the inner space. According to an embodiment of the disclosure, the mounting portion 4013 may be provided to be connected to the through-hole 4111a of the side frame 410.

Referring to FIG. 8B, the side frame 410 has a predetermined inclination from a portion of the mounting portion 4013 in the inner space, and a second inclined surface 4113 may be formed using a second machining tool T2 (e.g., a forming tool) disposed to move toward the side frame. In this case, the first machining tool T1 and the second machining tool T2 may be the same as or different from each other.

Figure 9A:
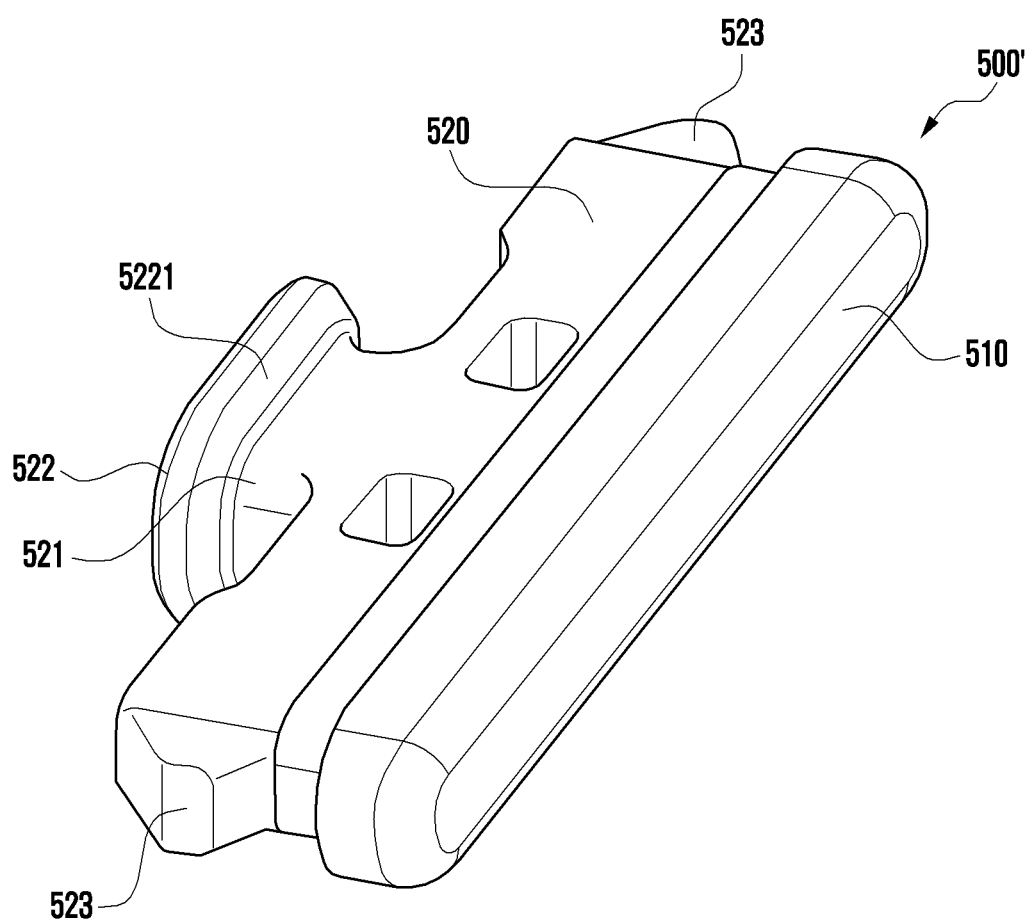
FIG. 9A is a perspective view illustrating a key button according to an embodiment of the disclosure.

FIG. 9A is a perspective view illustrating a key button according to an embodiment of the disclosure.

Figure 9B:
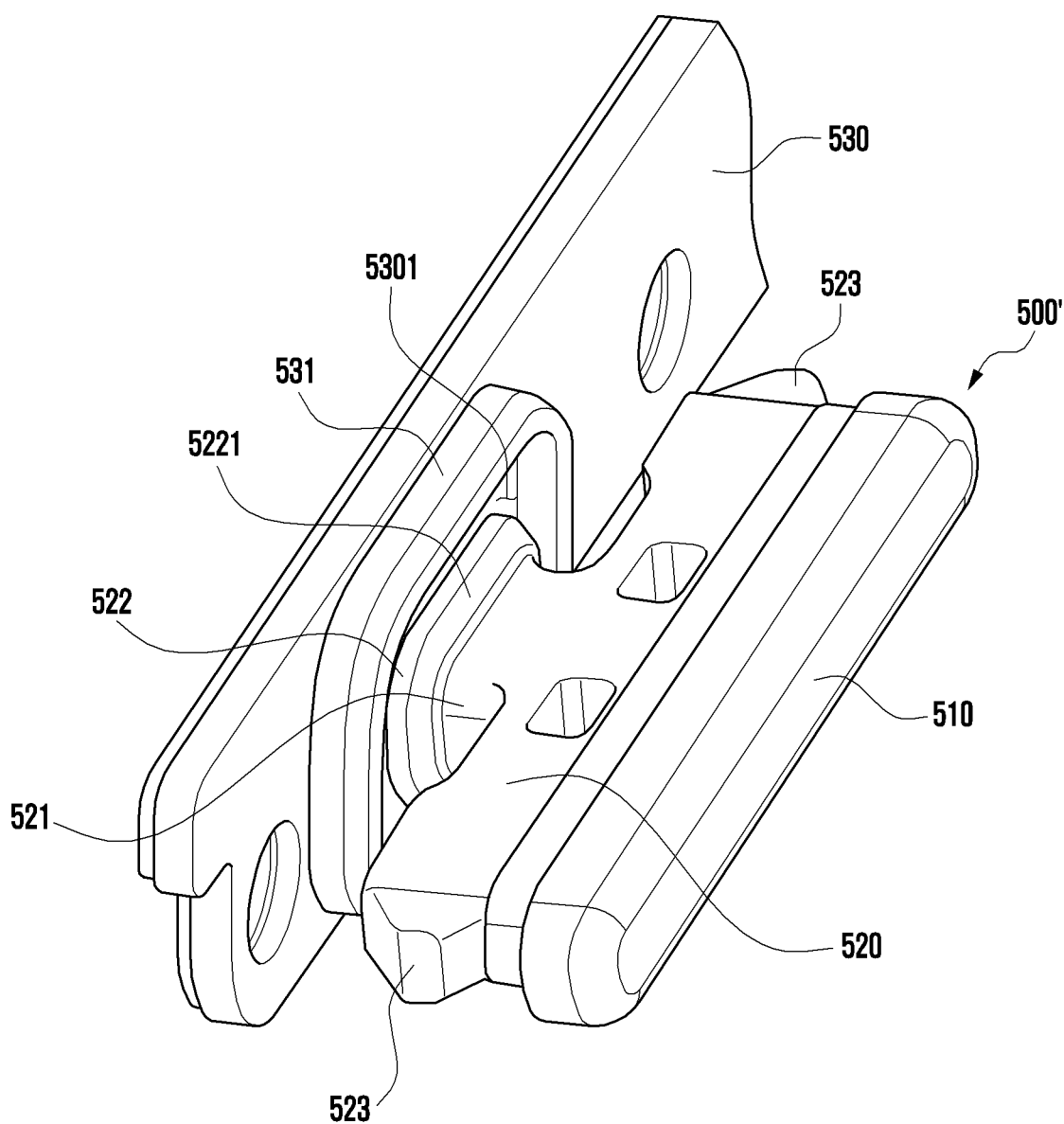
FIG. 9B is a view illustrating an arrangement configuration of a key button through a waterproof member according to an embodiment of the disclosure.

FIG. 9B is a view illustrating an arrangement configuration of a key button through a waterproof member according to an embodiment of the disclosure.

In describing the key button 500' of FIGS. 9A and 9B, the same components as those of the key button 500 of FIGS. 5A and 5B are denoted by the same reference numerals, and a detailed description thereof may be omitted. According to an embodiment of the disclosure, the key button 500' of FIGS. 9A and 9B may include the second key button 500' of FIG. 4.

Referring to FIGS. 9A and 9B, the key button 500' may include a key top 510 and a key base 520 coupled to the key top 510. According to an embodiment of the disclosure, the key button 500' may include a protrusion 521 protruding from the key base 520 and an engagement portion 522 disposed at the end of the protrusion 521 and having a larger size than the protrusion 521 at the end of the protrusion 521. According to an embodiment of the disclosure, the engagement portion 522 may include a first inclined surface 5221, as described above, and may have an engagement structure that passes through a through-hole (e.g., the through-hole 4112a in FIG. 10) in the side frame (e.g., the side frame 410 in FIG. 10) and is then engaged with the second inclined surface (e.g., the second inclined surface 4113 in FIG. 7) formed in the through-hole (e.g., through-hole 4112a in FIG. 10).

According to various embodiments of the disclosure, the key button 500' may further include an auxiliary engagement structure in addition to the engagement structure using the engagement portion 522 of the protrusion 521. For example, the key button 500' may further include a pair of engagement projections 523 protruding from the opposite ends of the key base 520. According to an embodiment of the disclosure, the engagement projections 523 may be integrally formed when the key base 520 is formed. According to an embodiment of the disclosure, when the key button 500' is mounted in the button accommodation recess (e.g., the button accommodation recess 4112 in FIG. 10) in the side frame (e.g., the side frame 410 in FIG. 10), the engagement projection 523 is engaged with engagement recesses (e.g., the engagement recesses 4014 in FIG. 10) in the opposite inner surfaces of the button accommodation recess (e.g., the button accommodation recess 4112 in FIG. 10), thereby supporting the engagement operation together with the engagement portion of the protrusion 521.

Figure 10:
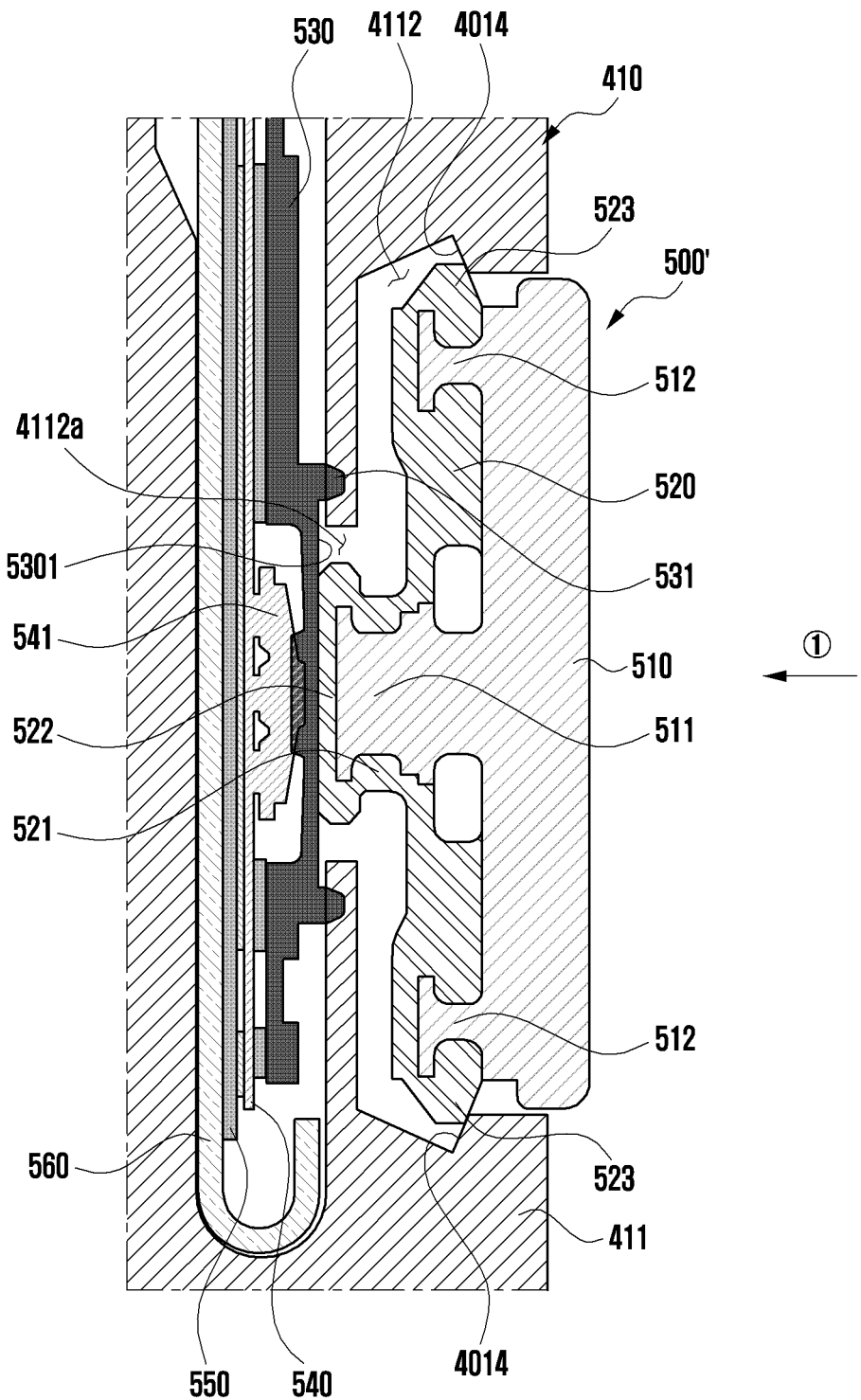
FIG. 10 is a cross-sectional view taken along line 10-10 in FIG. 4, in which a side frame, to which a key button is coupled, is illustrated according to an embodiment of the disclosure.

Referring to FIG. 9B, the key button 500' may be mounted in the manner in which the engagement 522, which has passed through the through-hole (e.g., the through-hole 4112a in FIG. 10) in the button accommodation recess (e.g., the button accommodation recess 4112 in FIG. 10) in the side frame (e.g., the side frame 410 in FIG. 10), is accommodated in the accommodation portion 5301 provided by the waterproof projection 531 of the waterproof member 530 disposed in the inner space of the electronic device (e.g., the electronic device 400 in FIG. 10).

FIG. 10 is a cross-sectional view taken along line 10-10 in FIG. 4, in which a side frame, to which a key button is coupled, is illustrated according to an embodiment of the disclosure.

Referring to FIG. 10, the key button 500' may be disposed in a manner in which the protrusion 521 and the engagement portion 522 pass through the through-hole 4112a formed in the button accommodation recess 4112 in the side frame 410. In this case, as described above, the key button 500' can be prevented from being separated since the first inclined surface (e.g., the first inclined surface of FIG. 7) on the engagement portion 522 of the protruding portion 521 is engaged with the second inclined surface (e.g., the second inclined surface 4113 in FIG. 7) in the through-hole 4112a. At the same time, the engagement operation of the key button 500' can be supported since the engagement projections 523 at the opposite ends of the key button 500' are engaged in the engagement recesses 4014 at the opposite ends of the inner surface of the button accommodation recess 4112. According to an embodiment of the disclosure, when the key button 500' is force-fitted into the button accommodation recess 4112 in the mounting direction (e.g., the direction ①), the engagement projection 523 can be engaged in the engagement recesses 4014. Accordingly, as described above, it is possible to prevent the key button 500' from being separated from the side frame 410 through the engagement structure based on the engagement portion 522 and the auxiliary engagement structure based on the engagement projection 523 and the engagement recesses 4014, and it is possible to cause the key button 500' to perform switching operation by pressing the dome key 541 of the key FPCB 540 via the waterproof member 530 by pressing the protrusion 521.

Figure 11A:
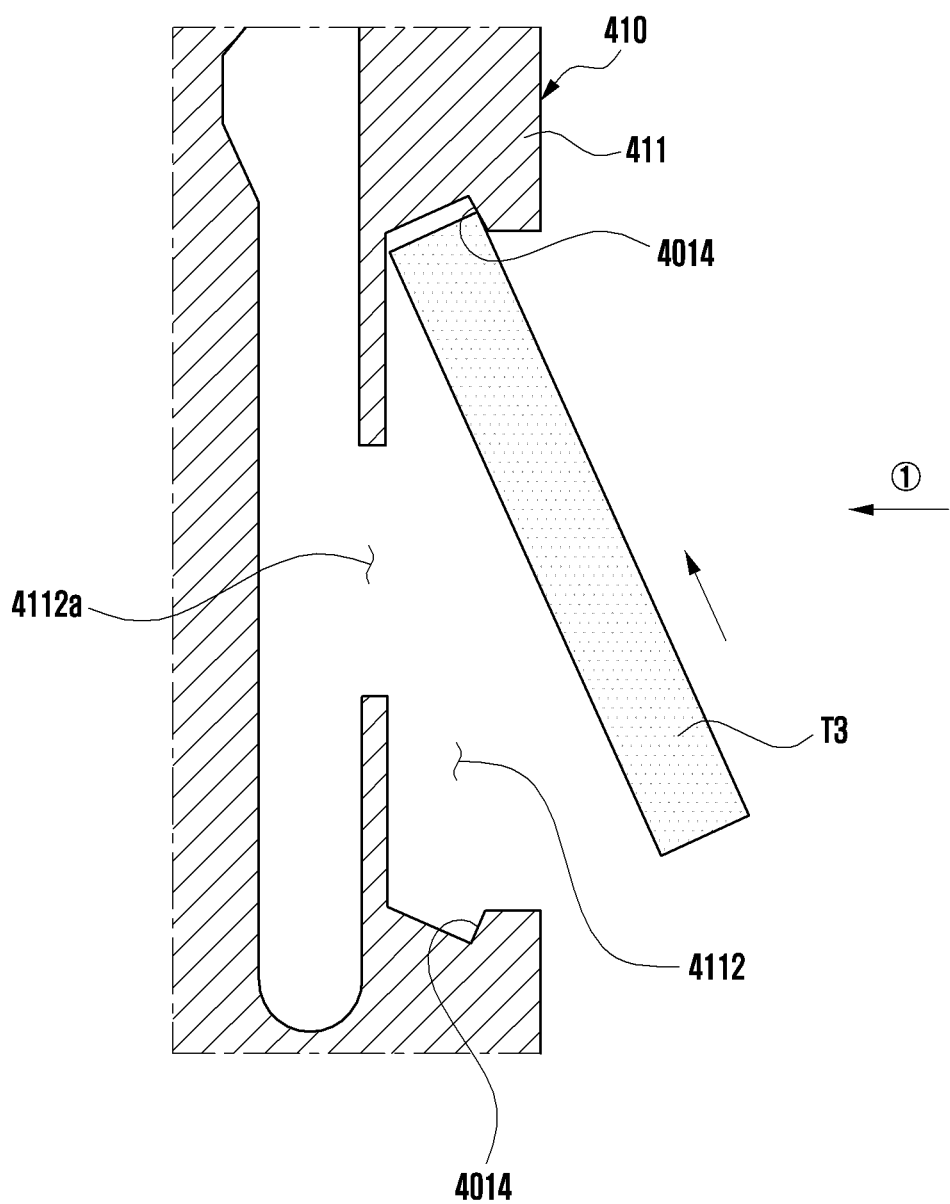
FIG. 11A is a view illustrating a method of machining an engagement recess formed in a button accommodation recess in a side frame according to an embodiment of the disclosure.

FIG. 11A is a view illustrating a method of machining an engagement recess formed in a button accommodation recess in a side frame according to an embodiment of the disclosure.

Figure 11B:
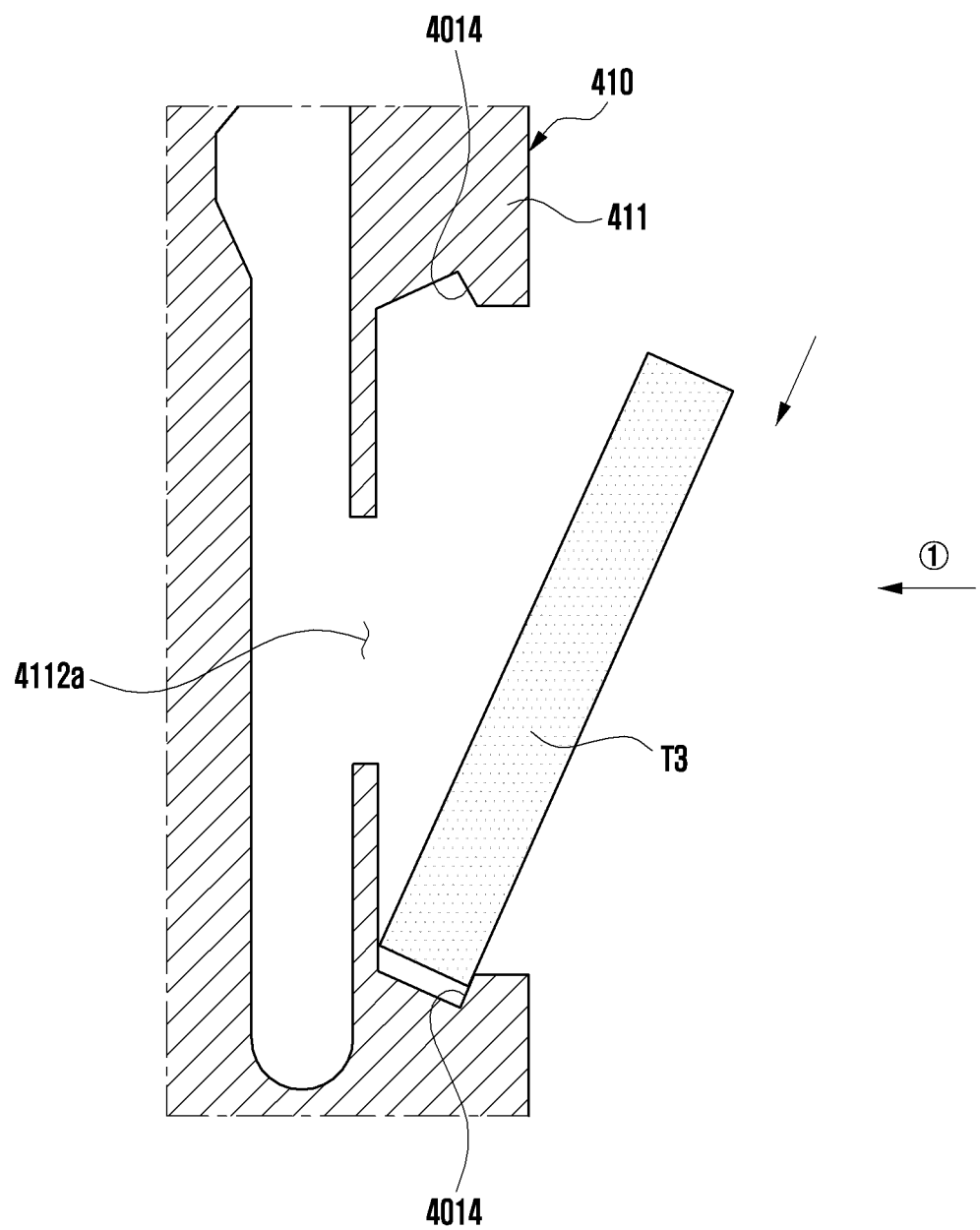
FIG. 11B is a view illustrating a method of machining an engagement recess formed in a button accommodation recess in a side frame according to an embodiment of the disclosure.

FIG. 11B is a view illustrating a method of machining an engagement recess formed in a button accommodation recess in a side frame according to an embodiment of the disclosure.

Referring to FIG. 11A, the side frame 410 may include one engagement recess 4014 formed using a third machining tool T3 (e.g., a forming tool), which is moved with an inclination from the outside to the inner surface of one side of the button accommodation recess 4112. According to an embodiment of the disclosure, the engagement recess 4014 is formed inside the button accommodation recess 4112, but is not connected to the inner space of the electronic device (e.g., the electronic device 400 in FIG. 10), and may be formed such that no machining mark remains on the outer surface (e.g., the first surface (e.g., the first surface 4011 in FIG. 8A) and/or the second surface (e.g., the second surface 4012 in FIG. 8A) of the side frame 410.

Referring to FIG. 11B, the side frame 410 may include a remaining one engagement recess 4014 formed using a third machining tool T3 (e.g., a forming tool), which is moved with an inclination from the outside to the inner surface of the other side of the button accommodation recess 4112. Accordingly, a pair of engagement grooves 4014 may accommodate engagement projections 523 protruding from the opposite sides of the key button 500'.

As another embodiment of the disclosure, various number of engagement recesses 4014 may be formed at various positions in the button accommodation recess 4112 as long as no machining mark remains on the outer surface (e.g., the first surface (e.g., the first surface 4011 in FIG. 8A) and/or the second surface (e.g., the first surface in FIG. 8A) of the side frame 410, and various number of engagement projections may be formed on the key buttons 500' at positions corresponding to the positions of the engagement recesses 4014. In another embodiment of the disclosure, the auxiliary engagement structure of the engagement projections 523 and the engagement recesses 4014 may also be applied to the mounting structure of the key button 500 illustrated in FIG. 7 described above.

Figure 12:
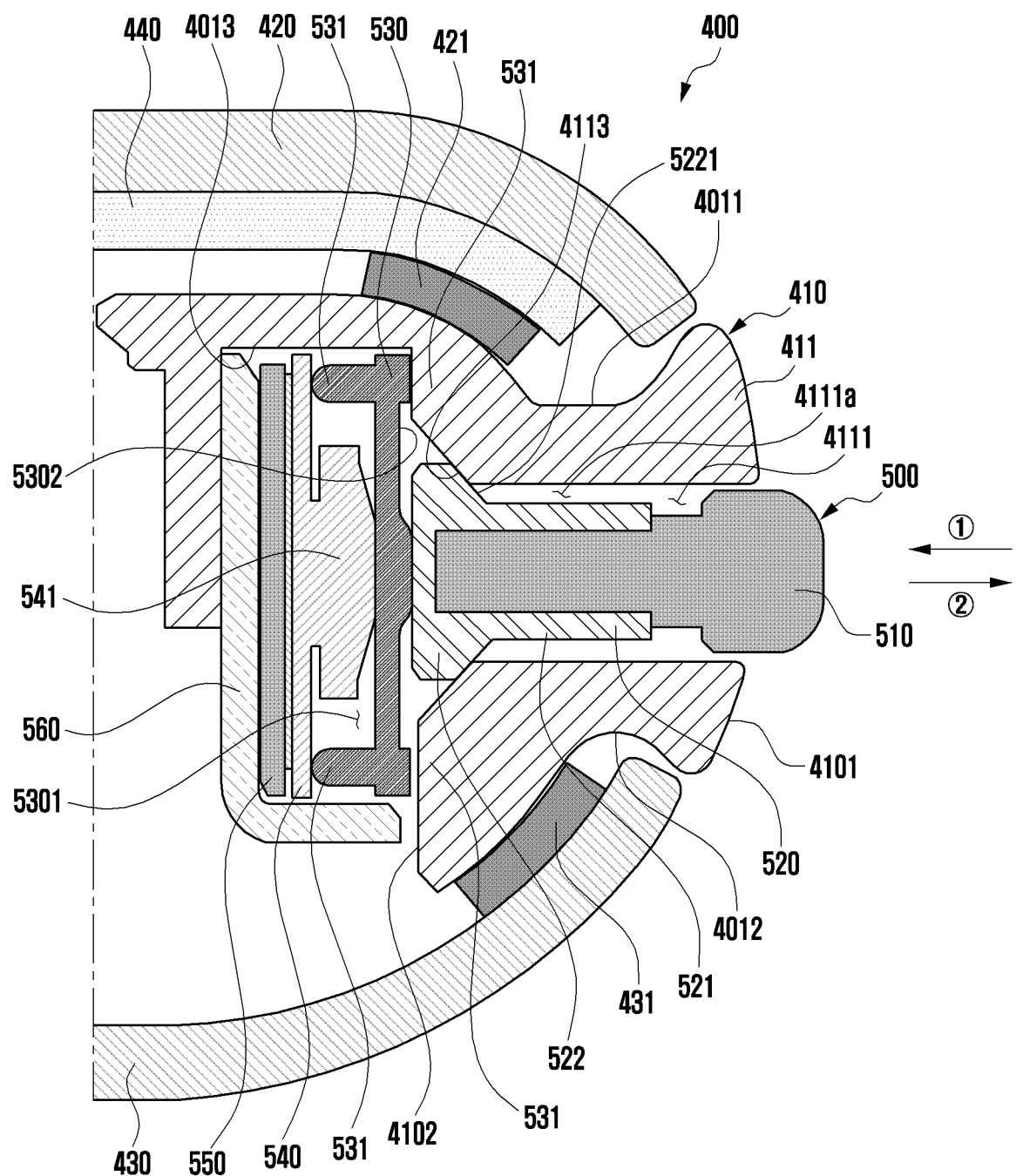
FIG. 12 is a cross-sectional view of a portion of an electronic device in which an arrangement of a waterproof member is illustrated according to an embodiment of the disclosure.

FIG. 12 is a cross-sectional view of a portion of an electronic device in which an arrangement of a waterproof member is illustrated according to an embodiment of the disclosure.

In describing the electronic device 400 of FIG. 12, the same components as those of the electronic device 400 of FIG. 7 are denoted by the same reference numerals, and a detailed description thereof may be omitted.

Referring to FIG. 12, the electronic device 400 may include a waterproof member 530, which is in contact with the inner surface of the side frame 410. According to an embodiment of the disclosure, the waterproof member 530 may include a waterproof projection 531 protruding in the mounting direction of the key button 500 (the direction ①). According to an embodiment of the disclosure, the waterproof member 530 may be in contact with the key FPCB 540 such that the first accommodation portion 5301 formed through the waterproof protrusion 531 accommodates the dome key 541 of the key FPCB 540. According to an embodiment of the disclosure, the waterproof member 530 may accommodate the engagement portion 522 of the key button 500 through the second accommodation portion 5302, which is formed when the waterproof member 530 is in close contact with the inner surface 4102 of the side frame 410. In this case, the waterproof member 530 is capable of implementing waterproof through the first accommodation portion 5301, which is formed through the waterproof protrusion 531, and the second accommodation portion 5302, which is formed when the waterproof member 530 is in contact with the inner surface 4102 of the side frame 410.

Figure 13:
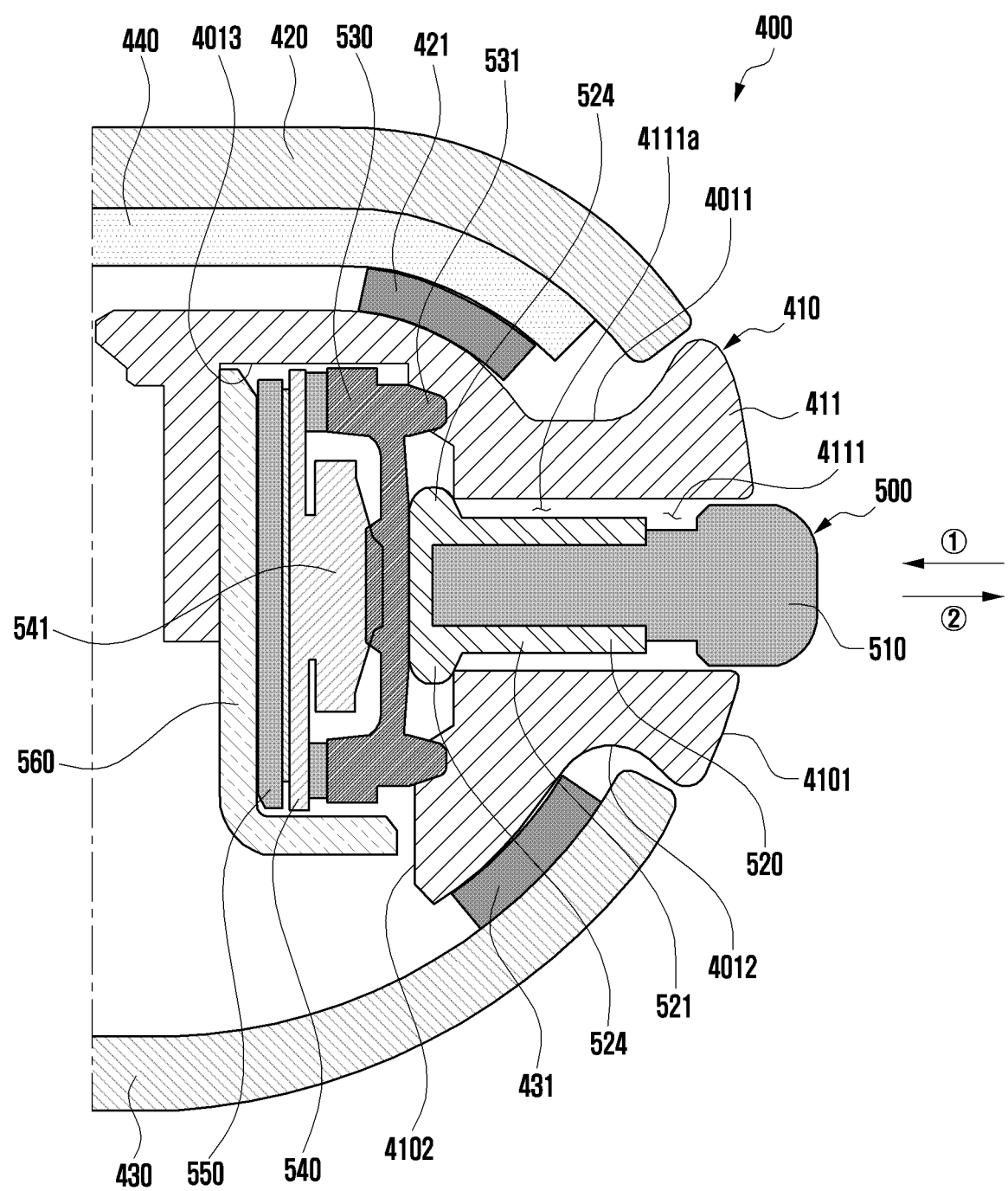
FIG. 13 is a cross-sectional view of a portion of an electronic device equipped with a key button including a separation prevention projection according to an embodiment of the disclosure.

FIG. 13 is a cross-sectional view of a portion of an electronic device equipped with a key button including a separation prevention projection according to an embodiment of the disclosure.

In describing the electronic device 400 of FIG. 13, the same components as those of the electronic device 400 of FIG. 7 are denoted by the same reference numerals, and a detailed description thereof may be omitted.

Referring to FIG. 13, the key button 500 may include a separation prevention projection 524 as an engagement portion protruding outwards from the end of the protrusion

521. In this case, the separation prevention projection 524 does not include any inclined surface, and accordingly, the through-hole 4111*a* may also have a uniform inner space without an inclined surface. For example, when the key button 500 is mounted through the button accommodation recess 4111, the separation prevention projection 524 may pass through the through-hole 4511*a* in a force-fitting manner, and the separation prevention projection 524 may be engaged with the inner surface 4102 of the side frame 410 around the through-hole 4111*a*, thereby helping prevent the key button 500 from being separated. According to an embodiment of the disclosure, the outer surface of the separation prevention protrusion 524 may have a curved shape, or may have a hook structure so as to be engaged after passing through the through-hole 4111*a*.

In the electronic device according to various embodiments of the disclosure, since the key button is provided with an engagement structure on the protrusion for pressing the dome key, it is possible to reinforce the rigidity of the side frame by excluding a separate engagement structure, and since the inflow of foreign matter through the engagement structure is fundamentally blocked, it is possible to help secure the reliability of the electronic device.

According to various embodiments of the disclosure, an electronic device (e.g., the electronic device 400 in FIG. 4) may include a housing (e.g., the housing 110 in FIG. 1) including an outer surface (e.g., the outer surface 4101 in FIG. 7) configured to at least partially form an external appearance of the electronic device, a button accommodation recess (e.g., the button accommodation recess 4111 in FIG. 7) having a predetermined depth from the outer surface in a first direction (e.g., the direction ① in FIG. 7) oriented to the inner space of the electronic device, and at least one through-hole (e.g., the through-hole 4111*a* in FIG. 7) connected to the inner surface of the side frame in the button accommodation recess (e.g., the inner surface in FIG. 7), and a key button (e.g., the key button 500 in FIG. 7) disposed through the button accommodation recess in the housing, and including a key top (e.g., the key top 510 in FIG. 7) inserted into the button accommodation recess and at least partially exposed to the outside of the outside of the side frame, and a key base (e.g., the key base 520 in FIG. 7) coupled to the key top, and including a protrusion (e.g., the protrusion 521 in FIG. 7) facing a key FPCB (e.g., the key FPCB 540 in FIG. 7) disposed in the inner space through the at least one through-hole. The protrusion may include an engagement portion (e.g., the separation prevention projection 524 in FIG. 13) formed at an end thereof to be larger than the protrusion, and after the protrusion passes through the at least one through-hole, the engagement portion may be engaged with the inner surface around the through-hole.

According to various embodiments of the disclosure, the engagement portion may include a first inclined surface, the at least one through-hole may include a second inclined surface, and after the protrusion passes through the at least one through-hole, the first inclined surface of the engagement portion may be engaged with the second inclined surface.

According to various embodiments of the disclosure, the first inclined surface may have a size that gradually increases toward the first direction, and the second inclined surface may be gradually narrowed toward a second direction opposite to the first direction.

According to various embodiments of the disclosure, the engagement portion may have an outer surface having a curved shape.

According to various shape, the engagement portion may have a hook shape to be engaged after passing through the at least one through-hole.

According to various embodiments of the disclosure, the key button may be provided in a manner of injection-molding the key base made of a polymer to the key top made of a metal material.

According to various embodiments of the disclosure, the electronic device may further include a support projection protruding from the key top, and the support projection may extend to the vicinity of an end of the protrusion of the key base.

According to various embodiments of the disclosure, the electronic device may further include at least one engagement projection protruding from at least a portion of the key base, and the button accommodation recess may include at least one engagement recess at a corresponding position at which the engagement projection is engaged in the engagement recess.

According to various embodiments of the disclosure, the engagement projection may be disposed at each of positions symmetrically opposite to each other in the key base.

According to various embodiments of the disclosure, the key FPCB may further include a dome key, and the dome key may be disposed at a position facing the protrusion of the key button.

According to various embodiments of the disclosure, the electronic device may further include a waterproof member disposed between the key FPCB and the inner surface of the housing to be in close contact therewith, the waterproof member being configured to seal a periphery of the through-hole and a periphery of the dome key.

According to various embodiments of the disclosure, the waterproof member may further include a first accommodation portion provided through a waterproof projection protruding toward the inner surface, and the engagement portion protruding from the through-hole may be accommodated in the first accommodation portion.

According to various embodiments of the disclosure, the waterproof member may further include a second accommodation portion provided through a waterproof projection protruding toward the key FPCB, and the dome key may be accommodated in the second accommodation portion.

According to various embodiments of the disclosure, the waterproof member may be made of at least one of rubber, urethane, or silicone.

According to various embodiments of the disclosure, the electronic device may further include a display disposed in the inner space to be visible from the outside through at least a portion of the front cover.

According to various embodiments of the disclosure, an electronic device (e.g., the electronic device 400 in FIG. 4) may include a front cover (e.g., the front plate 320 in FIG. 3), a rear cover (e.g., the rear plate 380 in FIG. 3) facing away from the front cover, a side frame (e.g., the side frame 410 in FIG. 7) connecting the front cover and the rear cover and including an outer surface (e.g., the outer surface 4101 in FIG. 7) configured to at least partially form the external appearance of the electronic device, a button accommodation recess (e.g., the button accommodation recess 4111 in FIG. 7) having a predetermined depth from the outer surface in a first direction (e.g., the direction ① in FIG. 7) oriented to the inner space of the electronic device, and at least one through-hole (e.g., the through-hole 4111*a* in FIG. 7) connected to the inner surface (e.g., the inner surface 4102 in FIG. 7) of the side frame in the button accommodation recess, and a key button (e.g., the key button 500 in FIG. 7)

disposed through the button accommodation recess and including a key top (e.g., the key top 510 in FIG. 7) inserted into the button accommodation recess and at least partially exposed to the outside of the side frame, and a key base (e.g., the key base 520 in FIG. 7) coupled to the key top and including a protrusion (e.g., the protrusion 521 in FIG. 7) facing a key FPCB (e.g., the key FPCB 540 in FIG. 7) disposed in the inner space through the at least one through-hole. The protrusion may include an engagement portion (e.g., the engagement portion 522 in FIG. 7) having a first inclined surface (e.g., the first inclined surface 5221 in FIG. 7), the at least one through-hole may include a second inclined surface (e.g., the second inclined surface 4113 in FIG. 7), and when the protrusion passes through the at least one through-hole, the first inclined surface of the engagement portion may be engaged with the second inclined surface.

According to various embodiments of the disclosure, the first inclined surface may have a size that gradually increases toward the first direction, and the second inclined surface may be gradually narrowed toward a second direction opposite to the first direction.

According to various embodiments of the disclosure, the electronic device may further include at least one engagement projection protruding from at least a portion of the key base, and the button accommodation recess may include at least one engagement recess at a corresponding position at which the engagement projection is engaged in the engagement recess.

According to various embodiments of the disclosure, an electronic device (e.g., the electronic device 400 in FIG. 4) may include a front cover (e.g., the front plate 320 in FIG. 3), a rear cover (e.g., the rear plate 380 in FIG. 3) facing away from the front cover, a side frame (e.g., the side frame 410 in FIG. 7) connecting the front cover and the rear cover and including an outer surface (e.g., the outer surface 4101 in FIG. 7) configured to at least partially form an external appearance of the electronic device, a button accommodation recess (e.g., the button accommodation recess 4111 in FIG. 7) having a predetermined depth from the outer surface in a first direction (e.g., the direction ① in FIG. 7) oriented to the inner space of the electronic device, and at least one through-hole (e.g., the through-hole 4111a in FIG. 7) connected to an inner surface (e.g., the inner surface 4102 in FIG. 7) of the side frame in the button accommodation recess, and a key button (e.g., the key button 500 in FIG. 7) disposed through the button accommodation recess and including a key top (e.g., the key top 510 in FIG. 7) inserted into the button accommodation recess and at least partially exposed to the outside of the side frame, and a key base (e.g., the key base 520 in FIG. 7) coupled to the key top and including a protrusion (e.g., the protrusion 521 in FIG. 7) facing a key FPCB (e.g., the key FPCB 540 in FIG. 7) disposed in the inner space through the at least one through-hole, wherein the protrusion includes an engagement portion (e.g., the separation prevention portion 524 in FIG. 13) formed at an end thereof to be larger than the protrusion, and after the protrusion passes through the at least one through-hole, the engagement portion is engaged with the inner surface around the through-hole, and a waterproof member (e.g., the waterproof member 530 in FIG. 7) disposed between the key FPCB and the inner surface of the side frame to be in close contact therewith, the waterproof member being configured to seal a periphery of the through-hole including the engagement portion and a periphery of the dome key.

According to various embodiments of the disclosure, the waterproof member may further include an accommodation portion provided through a waterproof projection protruding toward the inner surface, and the engagement portion protruding from the through-hole may be accommodated in the accommodation portion.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing comprising an outer surface configured to at least partially form an external appearance of the electronic device, a button accommodation recess having a predetermined depth from the outer surface in a first direction oriented to an inner space of the electronic device, and at least one through-hole connected to an inner surface of the housing in the button accommodation recess;
   a key button disposed through the button accommodation recess, the key button comprising a key top inserted into the button accommodation recess and at least partially exposed to an outside, and a key base coupled to the key top and comprising a protrusion facing a key flexible printed circuit board (FPCB) disposed in the inner space through the at least one through-hole; and
   a waterproof member disposed between the key FPCB and the inner surface of the housing to be in close contact therewith,
   wherein the protrusion comprises an engagement portion formed at an end thereof to be larger than the protrusion,
   wherein, after the protrusion passes through the at least one through-hole, the engagement portion is engaged with the inner surface around the at least one through-hole,
   wherein the waterproof member is configured to seal a periphery of the at least one through-hole, and
   wherein the key FPCB is configured to perform a switching operation through pressing of the waterproof member by the protrusion and the engagement portion.

2. The electronic device of claim 1,
   wherein the engagement portion comprises a first inclined surface,
   wherein the at least one through-hole comprises a second inclined surface, and
   wherein, after the protrusion passes through the at least one through-hole, the first inclined surface of the engagement portion is engaged with the second inclined surface.

3. The electronic device of claim 2,
   wherein the first inclined surface has a size that gradually increases toward the first direction, and
   wherein the second inclined surface is gradually narrowed toward a second direction opposite to the first direction.

4. The electronic device of claim 1, wherein the engagement portion has an outer surface having a curved shape.

5. The electronic device of claim 1, wherein the engagement portion has a hook shape to be engaged after passing through the at least one through-hole.

6. The electronic device of claim 1, wherein the key button is provided in a manner of injection-molding the key base made of a polymer to the key top made of a metal material.

7. The electronic device of claim 6, further comprising:
a support projection protruding from the key top,
wherein the support projection extends to a vicinity of an end of the protrusion of the key base.

8. The electronic device of claim 1, further comprising:
at least one engagement projection protruding from a portion of the key base,
wherein the button accommodation recess comprises at least one engagement recess at a corresponding position at which the at least one engagement projection is engaged in the at least one engagement recess.

9. The electronic device of claim 8, wherein the at least one engagement projection is disposed at each of positions symmetrically opposite to each other in the key base.

10. The electronic device of claim 1,
wherein the key FPCB further comprises a dome key, and
wherein the dome key is disposed at a position facing the protrusion of the key button.

11. The electronic device of claim 10,
wherein the waterproof member is configured to seal the periphery of the at least one through-hole and a periphery of the dome key.

12. The electronic device of claim 11,
wherein the waterproof member further comprises a first accommodation portion provided through a waterproof projection protruding toward the inner surface, and
wherein the engagement portion protruding from the at least one through-hole is accommodated in the first accommodation portion.

13. The electronic device of claim 12,
wherein the waterproof member further comprises a second accommodation portion provided through a waterproof projection protruding toward the key FPCB, and
wherein the dome key is accommodated in the second accommodation portion.

14. The electronic device of claim 11, wherein the waterproof member is made of at least one of urethane, acryl, or silicone.

15. The electronic device of claim 1, further comprising:
a display disposed in the inner space to be visible from the outside through at least a portion of a front cover of the electronic device.

16. An electronic device comprising:
a front cover;
a rear cover facing away from the front cover;
a side frame connecting the front cover and the rear cover, the side frame comprising an outer surface configured to at least partially form an external appearance of the electronic device, a button accommodation recess having a predetermined depth from the outer surface in a first direction oriented to an inner space of the electronic device, and at least one through-hole connected to an inner surface of the side frame in the button accommodation recess;
a key button disposed through the button accommodation recess, the key button comprising a key top inserted into the button accommodation recess and at least partially exposed to an outside, and a key base coupled to the key top and comprising a protrusion facing a key flexible printed circuit board (FPCB) disposed in the inner space through the at least one through-hole; and
a waterproof member disposed between the key FPCB and the inner surface of the side frame to be in close contact therewith,
wherein the protrusion comprises an engagement portion having a first inclined surface,
wherein the at least one through-hole comprises a second inclined surface,
wherein, when the protrusion passes through the at least one through-hole, the first inclined surface of the engagement portion is engaged with the second inclined surface,
wherein the waterproof member is configured to seal a periphery of the at least one through-hole, and
wherein the key FPCB is configured to perform a switching operation through which the protrusion and the engagement portion press the waterproof member.

17. The electronic device of claim 16,
wherein the first inclined surface has a size that gradually increases toward the first direction, and
wherein the second inclined surface is gradually narrowed toward a second direction opposite to the first direction.

18. The electronic device of claim 16, further comprising:
at least one engagement projection protruding from at least a portion of the key base,
wherein the button accommodation recess comprises at least one engagement recess at a corresponding position at which the at least one engagement projection is engaged in the at least one engagement recess.

19. An electronic device comprising:
a front cover;
a rear cover facing away from the front cover;
a side frame connecting the front cover and the rear cover, the side frame comprising an outer surface configured to at least partially form an external appearance of the electronic device, a button accommodation recess having a predetermined depth from the outer surface in a first direction oriented to an inner space of the electronic device, and at least one through-hole connected to an inner surface of the side frame in the button accommodation recess;
a key button disposed through the button accommodation recess, the key button comprising a key top inserted into the button accommodation recess and at least partially exposed to an outside, and a key base coupled to the key top and comprising a protrusion facing a key flexible printed circuit board (FPCB) disposed in the inner space through the at least one through-hole, wherein the protrusion comprises an engagement portion formed at an end thereof to be larger than the protrusion, and after the protrusion passes through the at least one through-hole, the engagement portion is engaged with the inner surface around the at least one through-hole; and
a waterproof member disposed between the key FPCB and the inner surface of the side frame to be in close contact therewith, the waterproof member being configured to seal a periphery of the at least one through-hole comprising the engagement portion and a periphery of a dome key.

20. The electronic device of claim 19,
wherein the waterproof member further comprises a first accommodation portion provided through a waterproof projection protruding toward the inner surface, and
wherein the engagement portion protruding from the at least one through-hole is accommodated in the first accommodation portion.

21. The electronic device of claim 20,
wherein the waterproof member further comprises a second accommodation portion is provided through the waterproof projection protruding toward the key FPCB, and wherein the dome key is accommodated in the second accommodation portion.

22. The electronic device of claim 21, wherein the waterproof member is made of at least one of urethane, acryl, or silicone.

\* \* \* \* \*